(12) United States Patent
Cho

(10) Patent No.: US 12,532,633 B2
(45) Date of Patent: Jan. 20, 2026

(54) DISPLAY DEVICE WITH REGION-SPECIFIC COLOR FILTER THICKNESS FOR UNIFORM LUMINANCE

(71) Applicant: Samsung Display Co., Ltd., Yongin-si (KR)

(72) Inventor: Seongmin Cho, Seongnam-si (KR)

(73) Assignee: SAMSUNG DISPLAY CO., LTD., Yongin-si (KR)

(*) Notice: Subject to any disclaimer, the term of this patent is extended or adjusted under 35 U.S.C. 154(b) by 533 days.

(21) Appl. No.: 17/829,901

(22) Filed: Jun. 1, 2022

(65) Prior Publication Data
US 2023/0062159 A1    Mar. 2, 2023

(30) Foreign Application Priority Data

Aug. 26, 2021    (KR) .......................... 10-2021-0113486

(51) Int. Cl.
*H10K 59/38*    (2023.01)
*H10K 59/121*    (2023.01)
(Continued)

(52) U.S. Cl.
CPC ........... *H10K 59/38* (2023.02); *H10K 59/121* (2023.02); *H10K 59/124* (2023.02); *H10K 59/8792* (2023.02); *H10K 2102/351* (2023.02)

(58) Field of Classification Search
CPC .. H10K 50/865; H10K 59/121; H10K 59/124; H10K 59/38; H10K 2102/351; H10K 59/40; H10K 59/8792
See application file for complete search history.

(56) References Cited

U.S. PATENT DOCUMENTS 8,035,778 B2   10/2011   Chan et al.
8,106,583 B2    1/2012   Shin et al.
(Continued)

FOREIGN PATENT DOCUMENTS

CN   111161643   5/2020
JP     6216540  10/2017
(Continued)

OTHER PUBLICATIONS

Kim, Gyeong Woo, et al. "Next generation smart window display using transparent organic display and light blocking screen." Optics Express 26.7 (2018): 8493-8502. (Year: 2018).*

*Primary Examiner* — Norman D Richards
*Assistant Examiner* — Ethan Edward Cutler
(74) *Attorney, Agent, or Firm* — F. CHAU & ASSOCIATES, LLC

(57) ABSTRACT

An electronic device includes a display panel including a first area including a light blocking area and a transmission area, a first pixel disposed in the first area, a second area adjacent to the first area, and a second pixel disposed in the second area, an input sensor disposed on the display panel, the input sensor including at least one insulating layer and a conductive layer, a black matrix disposed on the at least one insulating layer, a first color filter layer disposed on the at least one insulating layer, the first color filter overlapping the first pixel in a plan view, and a second color filter layer disposed on the at least one insulating layer, the second color filter overlapping the second pixel in a plan view. A thickness of the first color filter layer is smaller than a thickness of the second color filter layer.

20 Claims, 12 Drawing Sheets

(51) Int. Cl.
*H10K 59/124* (2023.01)
*H10K 59/80* (2023.01)
*H10K 102/00* (2023.01)

(56) References Cited

U.S. PATENT DOCUMENTS

| | | |
|---|---|---|
| 8,664,021 B2 | 3/2014 | Kim et al. |
| 8,866,170 B2 | 10/2014 | Moon et al. |
| 9,525,016 B2 | 12/2016 | Ahn et al. |
| 10,658,435 B2 | 5/2020 | Lin et al. |
| 11,036,101 B2 | 6/2021 | Park et al. |
| 11,302,900 B2 | 4/2022 | Kim et al. |
| 11,515,505 B2 | 11/2022 | Chung et al. |
| 2010/0238389 A1* | 9/2010 | Chan ................. G02F 1/133514 349/107 |
| 2013/0334507 A1 | 12/2013 | Shimoji et al. |
| 2019/0206945 A1* | 7/2019 | Lin .................... H10F 39/8053 |
| 2020/0019029 A1* | 1/2020 | Park ................. G02F 1/133512 |
| 2020/0159287 A1* | 5/2020 | Jeong ................. G06F 1/1656 |
| 2020/0258441 A1* | 8/2020 | Zhang ................ H10K 59/352 |
| 2021/0103352 A1* | 4/2021 | Lee ........................ H10K 59/12 |
| 2021/0335909 A1* | 10/2021 | Wang ................. H10K 59/353 |

FOREIGN PATENT DOCUMENTS

| | | |
|---|---|---|
| KR | 10-2016-0008672 A | 1/2016 |
| KR | 10-2020-0006649 | 1/2020 |
| KR | 10-2021-0028296 A | 3/2021 |
| KR | 10-2021-0093420 A | 7/2021 |

\* cited by examiner

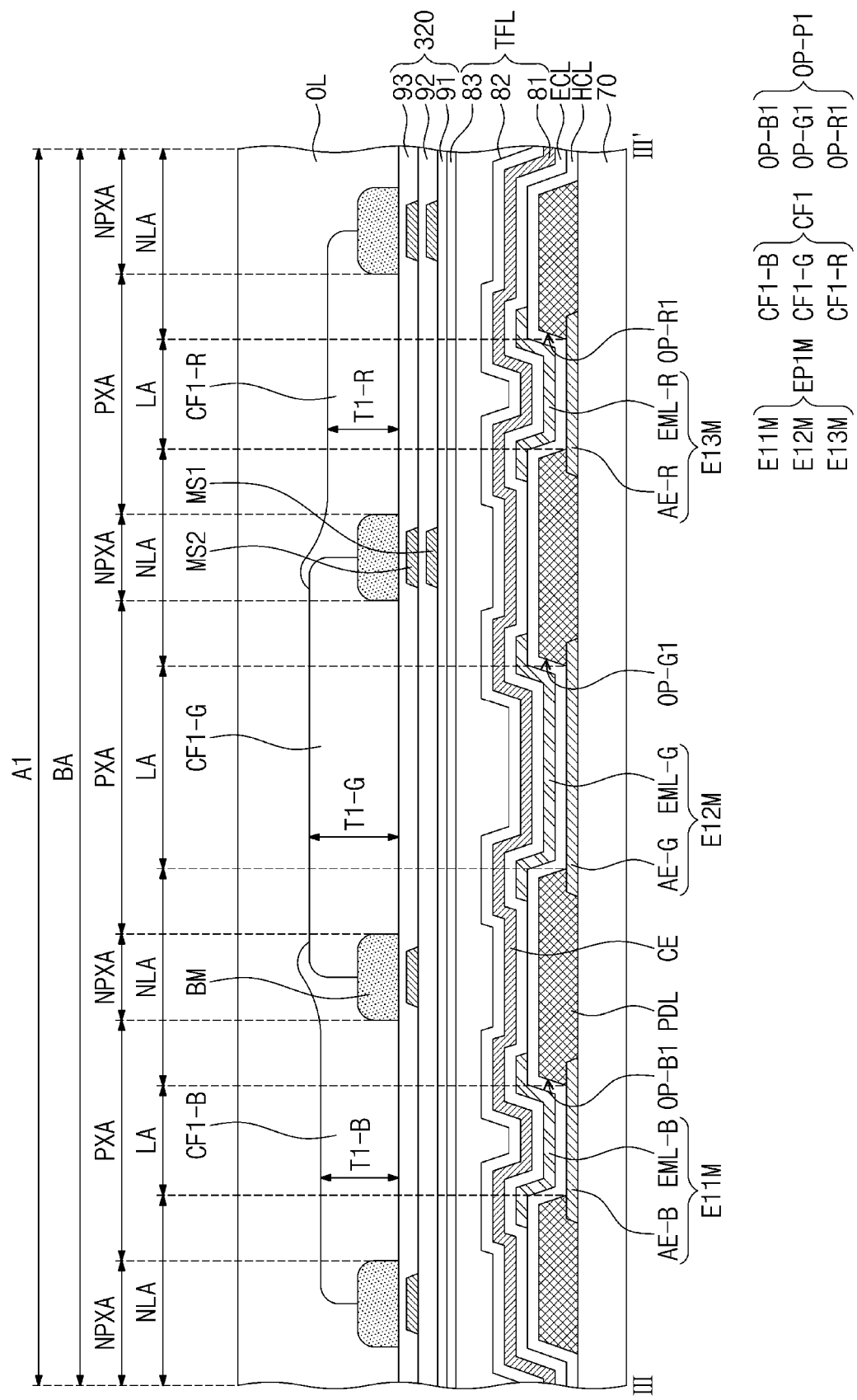

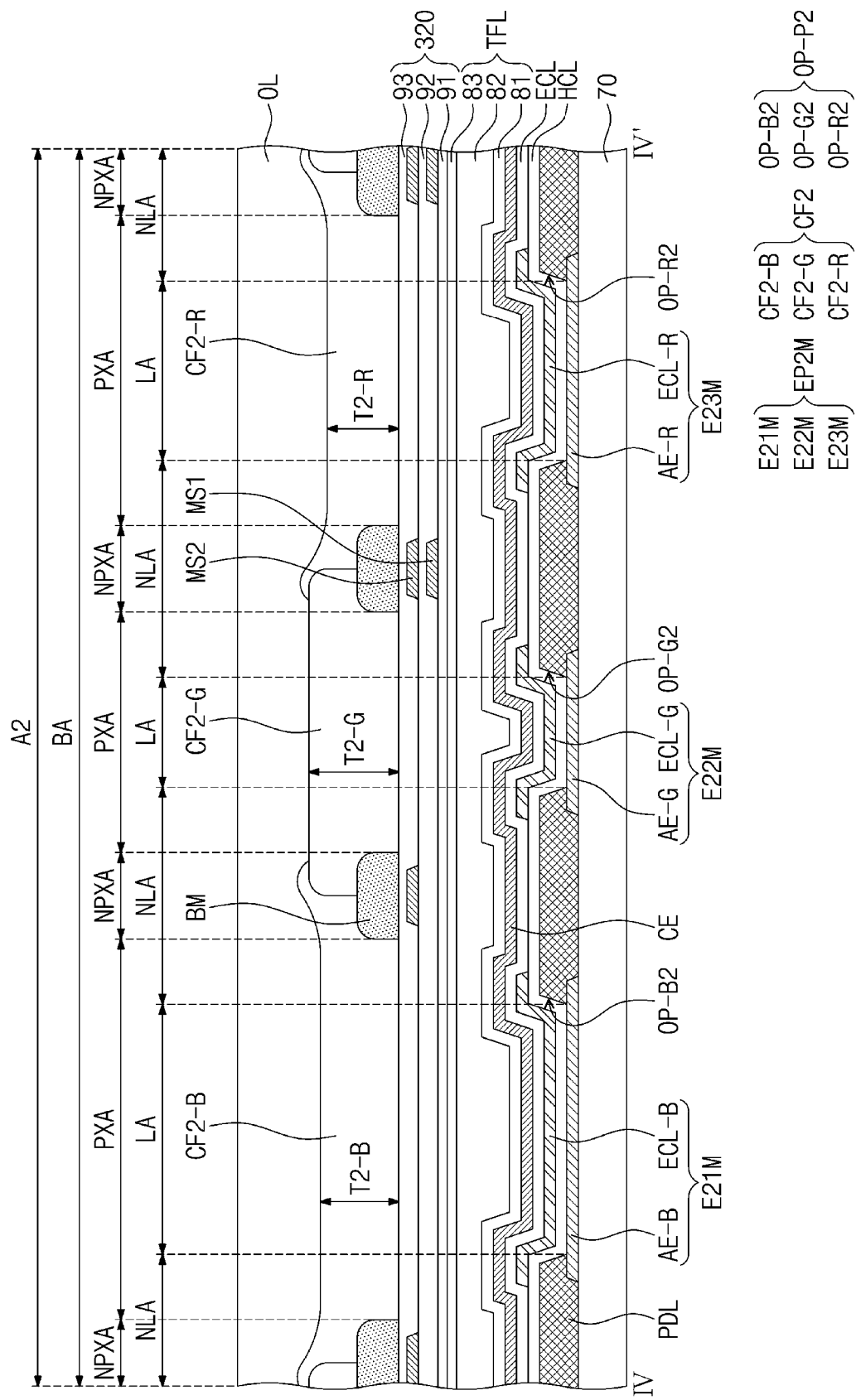

DISPLAY DEVICE WITH REGION-SPECIFIC COLOR FILTER THICKNESS FOR UNIFORM LUMINANCE

CROSS-REFERENCE TO RELATED APPLICATION(S)

This application claims priority to and benefits of Korean Patent Application No. 10-2021-0113486 under 35 U.S.C. § 119, filed on Aug. 26, 2021, in the Korean Intellectual Property Office, the entire contents of which are incorporated herein by reference.

BACKGROUND

1. Field of Disclosure

The disclosure relates to an electronic device including an area with improved transmittance.

2. Description of the Related Art

An electronic device includes various electronic components, such as a display panel and an electronic module. The electronic module includes a camera, an infrared sensor, or a proximity sensor. The electronic module is disposed under the display panel. An area of the display panel has a transmittance higher than a transmittance of another area of the display panel. The electronic module receives an external input through the area or provides an output through the area.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

The disclosure provides an electronic device including an area with improved transmittance in an active area.

The disclosure provides a display panel having a uniform lifespan over a display area with respect to a selected luminance and having improved lifespan in the display area corresponding to an electronic module.

Embodiments provide an electronic device that may include a display panel including a first area including a light blocking area and a transmission area, a first pixel disposed in the first area, a second area adjacent to the first area, and a second pixel disposed in the second area, an input sensor disposed on the display panel, the input sensor including at least one insulating layer and a conductive layer, a black matrix disposed on the at least one insulating layer, a first color filter layer disposed on the at least one insulating layer, the first color filter overlapping the first pixel in a plan view, and a second color filter layer disposed on the at least one insulating layer, the second color filter overlapping the second pixel in a plan view. A thickness of the first color filter layer may be smaller than a thickness of the second color filter layer.

The thickness of the first color filter layer may be equal to or greater than about 60% of the thickness of second color filter layer and may be equal to or smaller than about 90% of the thickness of the second color filter layer.

A difference between the thickness of the first color filter layer and the thickness of the second color filter layer may be equal to or greater than about 0.3 micrometers and may be equal to or smaller than about 1.5 micrometers.

Each of the first pixel and the second pixel may include at least one first sub-pixel, at least one second sub-pixel, and at least one third sub-pixel. Each of the at least one first sub-pixel, the at least one second sub-pixel, and the at least one third sub-pixel may emit a light having a different color from each other. Each of the first color filter layer and the second color filter layer may include a first sub-color filter, a second sub-color filter, and third sub-color filter. The first sub-color filter, the second sub-color filter, and the third sub-color filter each may respectively overlap the at least one first sub-pixel, the at least one second sub-pixel, and the at least one third sub-pixel, in a plan view.

In the first color filter layer, the first sub-color filter, the second sub-color filter, and the third sub-color filter may each have a thickness that is different from each other. In the second color filter layer, the first sub-color filter, the second sub-color filter, and the third sub-color filter may each have a thickness that is different from each other.

A difference between a thickness of the first sub-color filter of the first color filter layer and a thickness of the first sub-color filter of the second color filter layer may be substantially similar to a difference between a thickness of the second sub-color filter of the first color filter layer and a thickness of the second sub-color filter of the second color filter layer.

A difference between a thickness of the third sub-color filter of the first color filter layer and a thickness of the third sub-color filter of the second color filter layer may be greater than a difference between a thickness of the first sub-color filter of the first color filter layer and a thickness of the first sub-color filter of the second color filter layer.

An arrangement of the at least one first sub-pixel, the at least one second sub-pixel, and the at least one third sub-pixel of the first pixel, and an arrangement of the at least one first sub-pixel, the at least one second sub-pixel, and the at least one third sub-pixel of the second pixel may be different from each other.

In the first pixel, the at least one first sub-pixel may include two first sub-pixels, the at least one second sub-pixel may include four second sub-pixels, and the at least one third sub-pixel may include two third sub-pixels. The four second sub-pixels may be spaced apart from each other in a first direction. One of the two first sub-pixels and one of the two third sub-pixels may be spaced apart from each other in a second direction intersecting the first direction with the four second sub-pixels interposed between the one of the two first sub-pixels and the one of the two third sub-pixels. Another one of the two first sub-pixels may be spaced apart from the one of the two third sub-pixels in the first direction. Another one of the two third sub-pixels may be spaced apart from the one of the two first sub-pixels in the first direction.

Each of the four second sub-pixels may have a short side extending in the first direction and a long side extending in the second direction. Each of the two first sub-pixels and each of the two third sub-pixels may have a long side extending in the first direction and a short side extending in the second direction. The short side of each of the two first sub-pixels faces the short side of each of the two third sub-pixels that are spaced apart. The long side of each of the two first sub-pixels and the long side of each of the two third sub-pixels face the short side of at least one of the four second sub-pixels.

One of the two first sub-pixels may have right sides that extend in the first direction and may have first connection sides that connect the right sides adjacent to each other. The first connection sides extend in an oblique direction with respect to the first direction and the second direction.

One of the two third sub-pixels may have left sides that extend in the first direction and may have second connection sides that connect the left sides adjacent to each other. The second connection sides may extend in a direction intersecting the oblique direction.

In the second pixel, the at least one second sub-pixel may include two second sub-pixels spaced apart from each other in the second direction. The at least one first and sub-pixel of the second pixel and the at least one third sub-pixel of the second pixel may be spaced apart from each other in the second direction.

In the first pixel, the at least one second sub-pixel and the at least one third sub-pixel may be spaced apart from each other in a first direction. In the first pixel, the at least one first sub-pixel may be spaced apart from the at least one second sub-pixel and the at least one third sub-pixel in a second direction intersecting the first direction. In the first pixel, the at least one second sub-pixel and the at least one third sub-pixel each may have a short side extending in the first direction and a long side extending in the second direction, and the at least one first sub-pixel may have a long side extending in the first direction and a short side extending in the second direction. In the first pixel, the long side of the at least one first sub-pixel may overlap the short side of each of the at least one second sub-pixel and the at least one third sub-pixel, in the second direction.

The second pixel may have a circular shape or a quadrangular shape.

Each of the first pixel and the second pixel may include transistors and a light emitting diode electrically connected to at least one of the transistors. The display panel may include a base layer, a buffer layer disposed on the base layer, and a light blocking layer disposed between the buffer layer and the transistors. The light blocking layer may overlap the light blocking area of the first area in a plan view, and may not overlap the transmission area of the first area in a plan view.

The display panel may include inorganic insulating layers disposed on the light blocking layer and an organic insulating layer disposed on the inorganic insulating layers. The inorganic insulating layers may overlap the transmission area in a plan view and surround a transmission opening that exposes at least a portion of the buffer layer. The organic insulating layer may be disposed in the transmission opening, and may cover the exposed portion of the buffer layer.

The first color filter layer and the black matrix may overlap the light blocking area of the first area, in a plan view, and may not overlap the transmission area of the first area. The second color filter layer and the black matrix may overlap the second area, in a plan view.

The display panel further includes an overcoat layer disposed on the first color filter layer and the second color filter layer. At least a portion of an upper surface of the black matrix may be covered by the first color filter layer and second color filter layer. A portion of the upper surface of the black matrix adjacent to the transmission area may be covered by the first color filter layer. Another portion of the upper surface of the black matrix may be covered by the overcoat layer.

The electronic device further may include an electronic module overlapping the first area in a plan view, the electronic module being disposed under the display panel. The electronic module may include at least one of a light emitting module, a light receiving module, and a camera module.

According to the above, the color filter layer disposed in the area overlapping the electronic module has a thickness thinner than a thickness of the color filter layer disposed in the area that does not overlap the electronic module. As the light transmittance in the area overlapping the electronic module increases, a luminous lifespan is improved. Accordingly, the electronic device has a uniform luminous lifespan over an entire area of the display area.

BRIEF DESCRIPTION OF THE DRAWINGS

The above and other advantages of the disclosure will become more apparent by describing in detail embodiments thereof with reference to the attached drawings, in which:

FIG. 6A is a schematic cross-sectional view taken along a line III-III' shown in FIG. 4;

FIG. 6B is a schematic cross-sectional view taken along a line IV-IV' shown in FIG. 4;

DETAILED DESCRIPTION OF THE EMBODIMENTS

Figure 1:
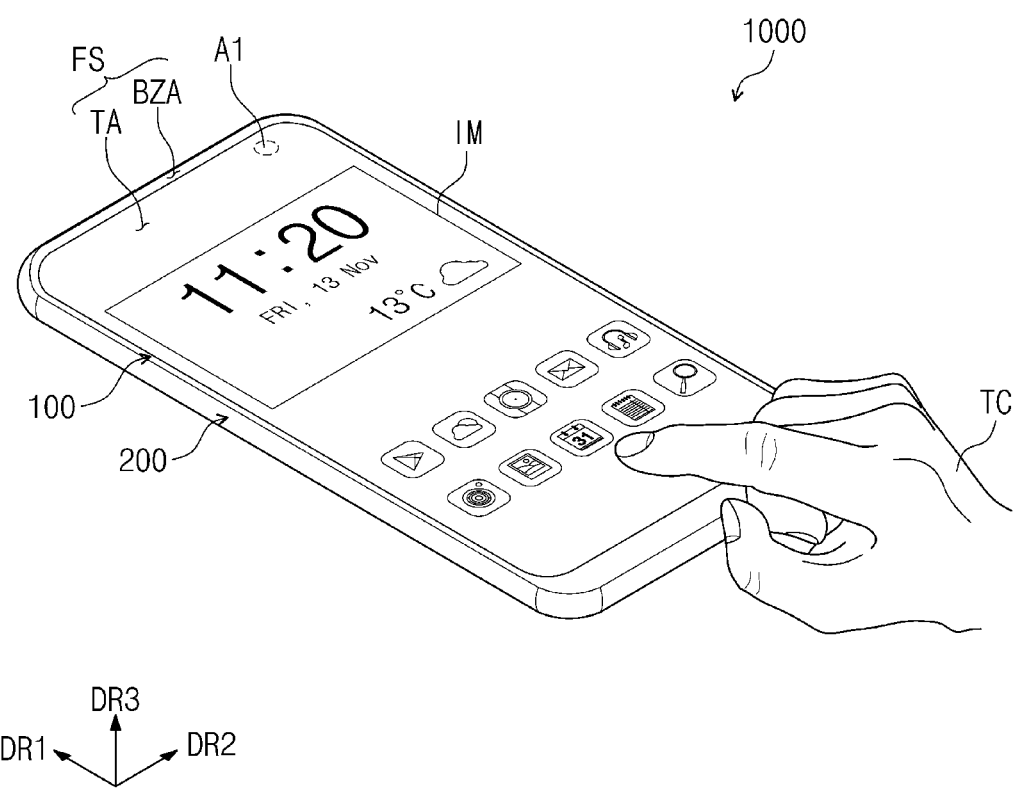
FIG. 1 is a schematic perspective view showing an electronic device according to an embodiment of the disclosure.

In the disclosure, it will be understood that when an element (or area, layer, or portion) is referred to as being "on," "connected to," or "coupled to" another element or layer, it can be directly on, connected or coupled to the other element or layer or intervening elements or layers may be present.

Like numerals refer to like elements throughout. In the drawings, the thickness, ratio, and dimension of components are exaggerated for effective description of the technical content.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

It will be understood that, although the terms first, second, etc. may be used herein to describe various elements, these elements should not be limited by these terms. These terms are only used to distinguish one element from another element. Thus, a first element discussed below could be termed a second element without departing from the teachings of the disclosure. As used herein, the singular forms, "a," "an," and "the" are intended to include the plural forms as well, unless the context clearly indicates otherwise.

Spatially relative terms, such as "beneath," "below," "lower," "above," "upper," and the like, may be used herein for ease of description to describe one element or feature's relationship to another element(s) or feature(s) as illustrated in the figures.

It will be further understood that the terms "includes" and/or "including" when used in this specification, specify the presence of stated features, integers, steps, operations, elements, and/or components, but do not preclude the presence or addition of one or more other features, integers, steps, operations, elements, components, and/or groups thereof.

"About," "substantially," or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within 30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the disclosure will be explained in detail with reference to the accompanying drawings.

Figure 2A:
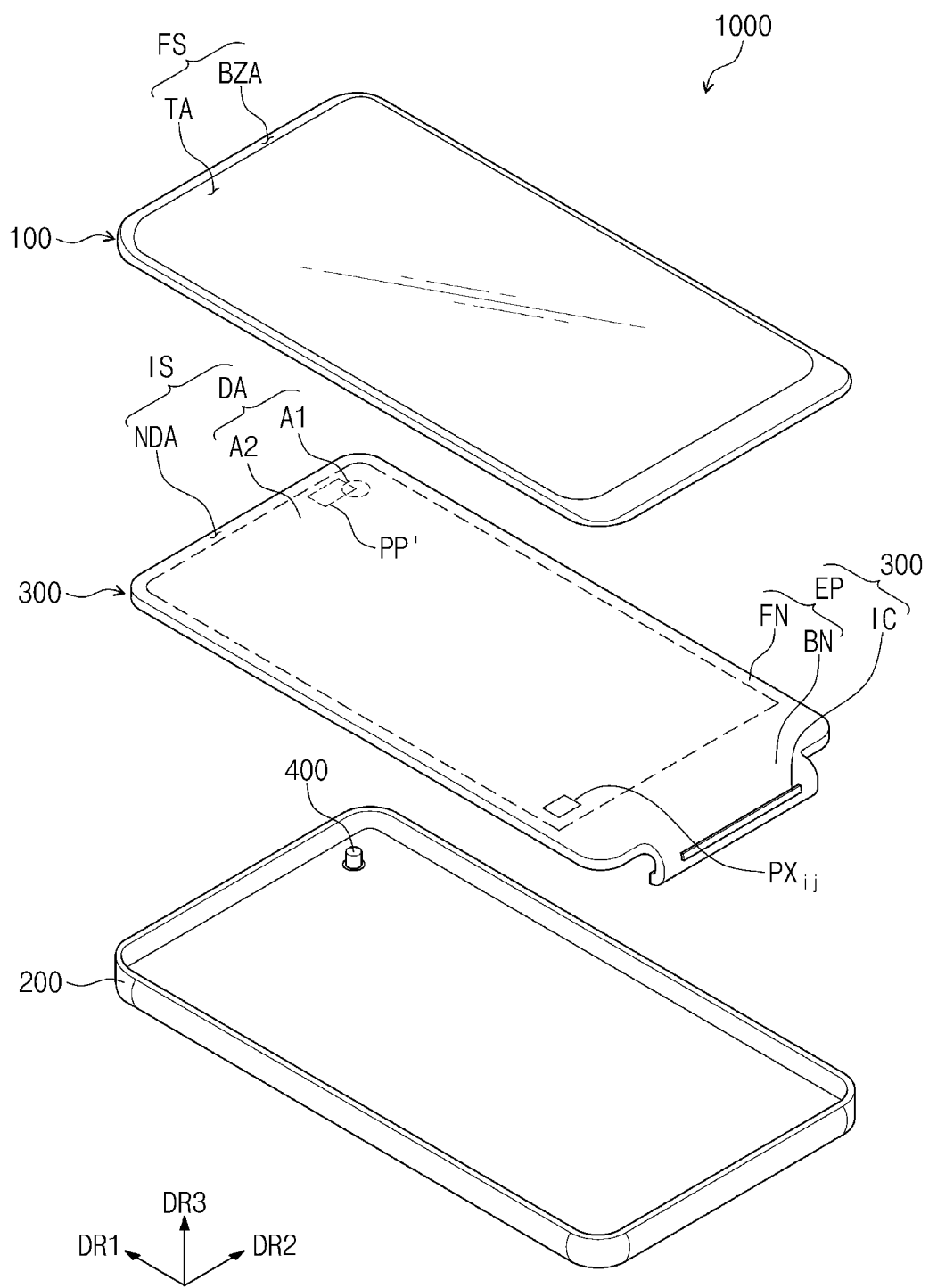
FIG. 2A is an exploded schematic perspective view showing an electronic device according to an embodiment of the disclosure.
Figure 2B:
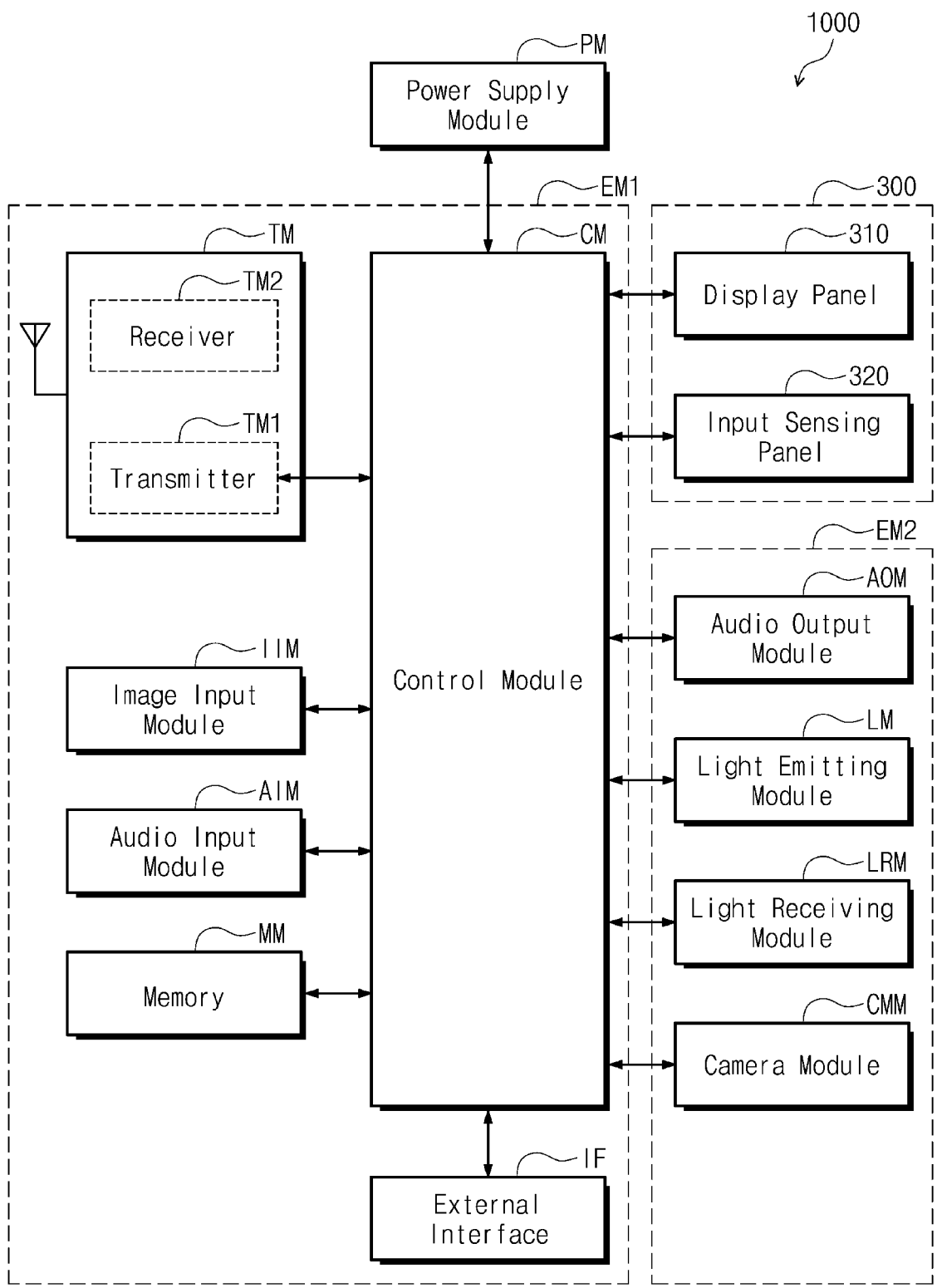
FIG. 2B is a block diagram showing an electronic device according to an embodiment of the disclosure.
Figure 3:
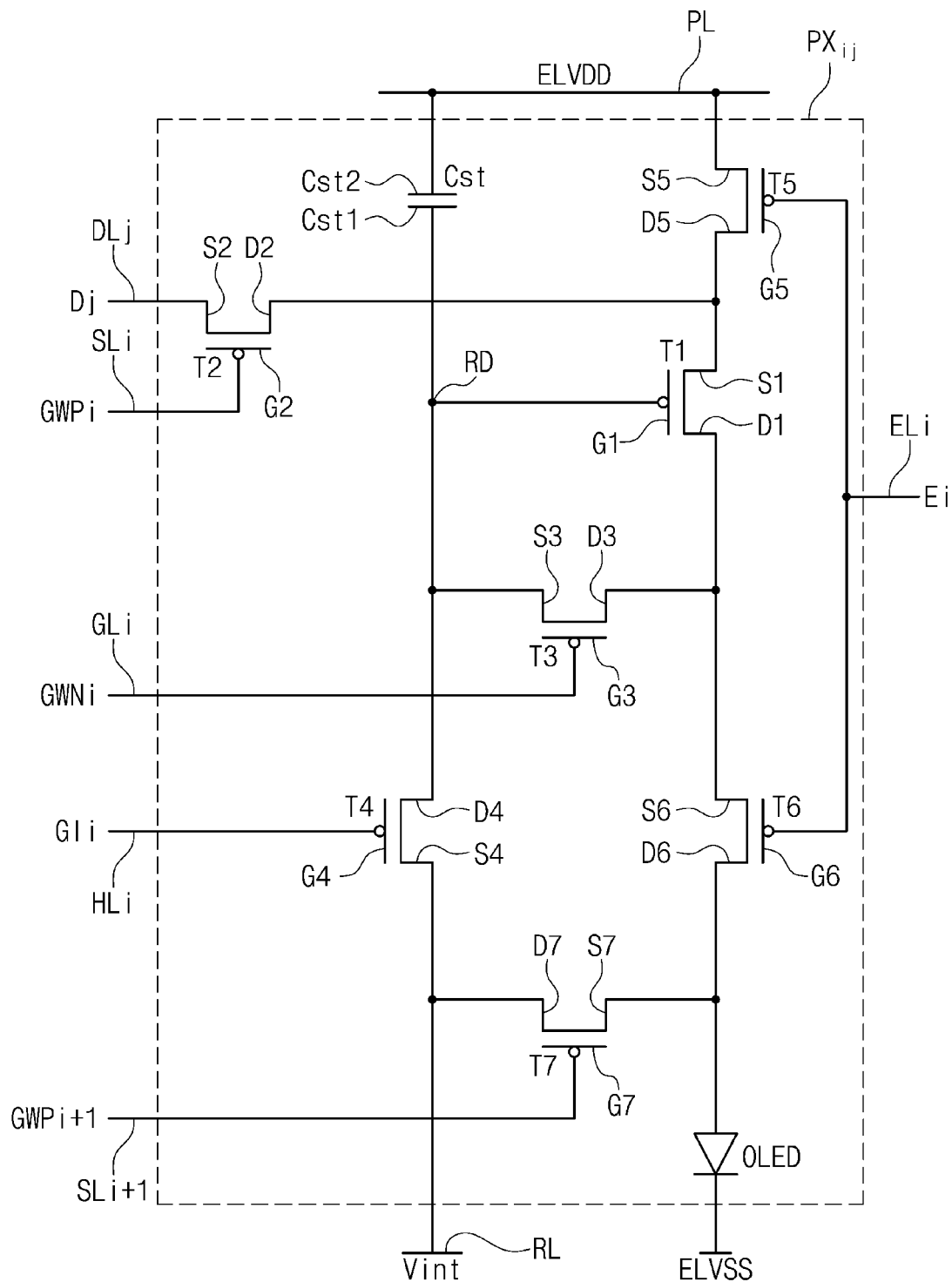
FIG. 3 is schematic diagram of an equivalent circuit showing a pixel according to an embodiment of the disclosure.

FIG. 1 is a schematic perspective view showing an electronic device 1000 according to an embodiment of the disclosure. FIG. 2A is an exploded schematic perspective view showing the electronic device 1000 according to an embodiment of the disclosure. FIG. 2B is a block diagram showing the electronic device 1000 according to an embodiment of the disclosure. FIG. 3 is schematic diagram of an equivalent circuit diagram showing a pixel PXij according to an embodiment of the disclosure.

The electronic device 1000 may be a device activated in response to an electrical signal. The electronic device 1000 may include various embodiments. For example, the electronic device 1000 may include a tablet computer, a notebook computer, a computer, a smart television, or the like. In an embodiment, a smartphone will be described as an example of the electronic device 1000.

The electronic device 1000 may display an image IM through a display surface FS, which is substantially parallel to a plane formed by axes in the first direction DR1 and the second direction DR2. The display surface FS may face toward the third direction DR3. The display surface FS, through which the image IM is displayed, may correspond to a front surface of the electronic device 1000 and a front surface FS of a window 100.

Hereinafter, the display surface and the front surface of the electronic device 1000 and the front surface of the window 100 will be assigned with the same reference numeral. The image IM may include a still image as well as a video. FIG. 1 shows a clock widget and application icons as examples of the image IM.

In an embodiment, front (or upper) and rear (or lower) surfaces of each member of the electronic device 1000 may be defined with respect to a direction in which the image IM is displayed. The front and rear surfaces may be opposite to each other in the third direction DR3, and a normal line direction of each of the front and rear surfaces may be substantially parallel to the third direction DR3. A separation distance between the front and rear surfaces may correspond to a thickness in the third direction DR3 of a display module 300 (refer to FIG. 2A).

According to an embodiment, the electronic device 1000 may sense a user input TC applied thereto from the outside. The user input TC may include various types of external inputs, such as a part of a user's body, light, heat, or pressure. In an embodiment, the user input TC is shown as a hand of the user applied to the front surface of the electronic device 1000, however, this is merely an example. As described above, the user input TC may be provided in various forms. The electronic device 1000 may sense the user input TC applied to a side or rear surface of the electronic device 1000 depending on its structure, however, it should not be limited to a specific embodiment.

In an embodiment, a first area A1 may be defined in a transmission area TA. The first area A1 may be an area of the display module 300 overlapping an electronic module 400. In FIG. 2A, the first area A1 is illustrated as a circular shape disposed at an upper right end, however, the first area A1 should not be limited thereto. According to an embodiment, the first area A1 may have various shapes in the display module 300 depending on the shape of the electronic modules 400, and the number of first areas A1 may vary according to the number of electronic modules 400. However, the embodiments should not be particularly limited.

The electronic device 1000 may receive external signals required for the electronic module 400 via the first area A1 or may provide output signals from the electronic module 400 to the outside via the first area A1. According to the disclosure, as the first area A1 is defined to overlap the transmission area TA, the size of a bezel area BZA defining (or surrounding) the transmission area TA may decrease. This will be described in detail below.

Referring to FIG. 2A, the electronic device 1000 may include the window 100, a housing 200, the display module 300, and the electronic module 400. In an embodiment, the window 100 and the housing 200 may be coupled to each other to provide an exterior of the electronic device 1000.

The window 100 may include an insulating panel. For example, the window 100 may include a glass material, a plastic material, or a combination thereof.

The front surface FS of the window 100 may define the front surface of the electronic device 1000 as described above. The transmission area TA may be an optically transparent area. For example, the transmission area TA may be an area having a visible light transmittance of about 90% or more.

The bezel area BZA may be an area having a relatively lower transmittance as compared with the transmission area TA. The bezel area BZA may define a shape of the transmission area TA. The bezel area BZA may be disposed adjacent to the transmission area TA and may surround the transmission area TA.

The bezel area BZA may have a selected color. The bezel area BZA may be defined by a bezel layer provided separately from a transparent substrate defining the transmission area TA or may be defined by an ink layer that may be inserted into the transparent substrate, or may be formed by coloring the transparent substrate.

The display module 300 may include an electronic panel EP and a driving circuit IC.

The electronic panel EP may display the image IM and may sense the user input TC (refer to FIG. 1). The electronic panel EP may include a front surface IS in which a display area DA and a non-display area NDA are defined. The display area DA may be an area activated in response to an electrical signal.

In an embodiment, the display area DA may be an area where image IM is displayed, and user input TC is sensed. The display area DA may be an area in which pixels PXij, described below, are arranged.

The transmission area TA may overlap at least the display area DA. For example, the transmission area TA may overlap all or at least a portion of the display area DA. Accordingly, the user may view the image IM and may provide the user input TC via the transmission area TA, however, the embodiments are not limited thereto. In other examples, the area through which the image IM is displayed and the area through which the external input TC is sensed may be separated from each other in the display area DA.

The non-display area NDA may be covered by the bezel area BZA. The non-display area NDA may be disposed adjacent to the display area DA. The non-display area NDA may surround the display area DA. The non-display area NDA may be an area through which the image IM is not displayed. A driving circuit or a driving line to drive the display area DA may be disposed in the non-display area NDA.

In an embodiment, the electronic panel EP may be assembled in a flat state in which the display area DA and the non-display area NDA face the window 100, however, the embodiments are not limited thereto. In other examples, a portion of the non-display area NDA of the electronic panel EP may be curved. The portion of the non-display area NDA may be bent toward the rear surface of the electronic device 1000, and thus, the bezel area BZA in the front surface of the electronic device 1000 may be reduced. According to an embodiment, the electronic panel EP may be assembled while a portion of the display area DA is in a curved state. Further, the non-display area NDA may be omitted from the electronic panel EP according to an embodiment of the disclosure.

The display area DA may include the first area A1 and a second area A2. The first area A1 may have a relatively higher light transmittance than that of the second area A2. The first area A1 may be defined as an area of the display module 300, which overlaps an area where the electronic module 400 is disposed in the housing 200. In an embodiment, the first area A1 is shown as having a circular shape, however, the embodiments are not limited thereto. In other examples, the first area A1 may have a variety of shapes, such as a polygonal shape, an oval shape, a shape with at least one curved line, or other shape.

The second area A2 may be defined adjacent to the first area A1. In an embodiment, the second area A2 may surround the entire of the first area A1, however, the embodiments are not limited thereto. In other examples, the second area A2 may be defined adjacent to only a portion of an edge of the first area A1 and should not be particularly limited.

Referring to FIG. 2B, the electronic panel EP of the display module 300 may include a display panel 310 and an input sensor 320. The display panel 310 may include components to generate the image IM (refer to FIG. 1). The image IM generated by the display panel 310 may be displayed on the display surface IS (refer to FIG. 2A) through the transmission area TA (refer to FIG. 2A) and viewed by the user.

The input sensor 320 may sense the user input TC (refer to FIG. 1) applied thereto from the outside. As described above, the input sensor 320 may sense the user input TC applied to the window 100 (refer to FIG. 1).

Referring to FIG. 2A, the electronic panel EP may include a flat portion FN and a bending portion BN. The flat portion FN may be assembled to be substantially parallel to a plane defined by axes in the first direction DR1 and in the second direction DR2. The display area DA may be defined in the flat portion FN.

The bending portion BN may extend and may be bent from the flat portion FN. The bending portion BN may be assembled to be bent from the flat portion FN and disposed on a rear side of the flat portion FN. Since the bending portion BN overlaps the flat portion FN in a plane when being assembled, the bezel area BZA of the electronic device 1000 may decrease. In other examples, and the bending portion BN may be omitted from the electronic panel EP.

The driving circuit IC may be mounted on the bending portion BN. The driving circuit IC may be provided as a chip. However, the embodiments are not limited thereto. In other examples, the driving circuit IC may be electrically connected to the electronic panel EP via a flexible circuit board after being provided to a separate circuit board.

The driving circuit IC may be electrically connected to the display area DA and may apply electrical signals to the display area DA. For example, the driving circuit IC may include a data driving circuit and may apply data signals to pixels arranged in the display area DA. According to an embodiment, the driving circuit IC may include a touch driving circuit and may be electrically connected to the input sensor disposed in the display area DA. In other examples, the driving circuit IC may include additional circuits and may apply a variety of electrical signals to the display area DA, and are not particularly limited.

Although not shown in figures, the electronic device 1000 may further include a main circuit board electrically connected to the electronic panel EP and the driving circuit IC. The main circuit board may include various driving circuits that drive the electronic panel EP as well as a connector to provide power. The main circuit board may be a rigid printed circuit board (PCB), however, in other examples, the main circuit board may be a flexible circuit board, and is not particularly limited.

The electronic module 400 may be disposed under the display module 300. The electronic module 400 may receive the external input via the first area A1 or may output signals via the first area A1. According to the disclosure, as the first area A1 having a relatively high transmittance is defined in the display area DA, the electronic module 400 may be disposed to overlap the display area DA. Accordingly, an increase in size of the bezel area BZA (and an increase in the size of the non-display area NDA) may be prevented.

Referring to FIG. 2B, the electronic device 1000 may include the display module 300, a power supply module PM, a first electronic module EM1, and a second electronic module EM2. The display module 300, the power supply module PM, the first electronic module EM1, and the second electronic module EM2 may be electrically connected to each other.

The power supply module PM may supply power required to operate the electronic device 1000. The power supply module PM may include a battery module.

The first electronic module EM1 and the second electronic module EM2 may include various functional modules to operate the electronic device 1000. The first electronic module EM1 may be mounted directly on a mother board that is electrically connected to the electronic panel EP or may be electrically connected to the mother board via a connector (not shown) after being mounted on a separate substrate.

The first electronic module EM1 may include a control module CM, a wireless communication module TM, an image input module IIM, an audio input module AIM, a memory MM, and an external interface IF. Some modules among the modules may be electrically connected to the mother board through a flexible circuit board without being mounted on the mother board.

The control module CM may control the overall operation of the electronic device 1000. The control module CM may be, but not limited to, a microprocessor. For example, the control module CM may activate or deactivate the display module 300. The control module CM may control other modules, such as the image input module IIM, the audio input module AIM, or the like, based on a touch signal provided from the display module 300.

The wireless communication module TM may transmit/receive a wireless signal to/from other terminals using a Bluetooth or Wi-Fi link. The wireless communication module TM may transmit/receive a voice signal using a general communication line. The wireless communication module TM may include a transmitter TM1 that modulates a signal to be transmitted and transmits the modulated signal and a receiver TM2 that demodulates the received signal.

The image input module IIM may process an image signal and may convert the image signal into image data that may be displayed through the display module 300. The audio input module AIM may receive an external sound signal through a microphone in a record mode or a voice recognition mode and may convert the external sound signal to electrical voice data.

The external interface IF may serve as an interface between the control module CM and external devices, such as an external charger, a wired/wireless data port, a card socket e.g., a memory card and a SIM/UIM card, etc.

The second electronic module EM2 may include an audio output module AOM, a light emitting module LM, a light receiving module LRM, and a camera module CMM. The components may be mounted directly on the mother board, may be electrically connected to the electronic panel EP via a connector (not shown) after being mounted on a separate substrate, or may be electrically connected to the first electronic module EM1.

The audio output module AOM may convert the sound data provided from the wireless communication module TM or the sound data stored in the memory MM and may output the converted sound data to the outside.

The light emitting module LM may generate a light and may output the light. The light emitting module LM may emit an infrared ray. The light emitting module LM may include an LED element. The light receiving module LRM may sense the infrared ray. The light receiving module LRM may be activated when an infrared ray having a selected level or higher is sensed. The light receiving module LRM may include a complementary metal oxide semiconductor (CMOS) sensor. The infrared ray generated by and output from the light emitting module LM may be reflected by an external object, e.g., a user's finger or face, and the reflected infrared ray may be incident into the light receiving module LRM. The camera module CMM may take an image of an external object.

According to an embodiment, the electronic module 400 shown in FIG. 2A may include at least one of the components of the second electronic module EM2. For example, the electronic module 400 may include at least one of a camera, a speaker, a light sensing sensor, and a heat sensing sensor. The electronic module 400 may sense the external object via the first area A1 or may provide a sound signal, such as a voice, to the outside through the first area A1. The electronic module 400 may include multiple components, and is not particularly limited thereto. Although not shown in figures, the electronic module 400 may be attached to the electronic panel EP by a separate adhesive.

Referring to FIG. 2A again, the housing 200 may be coupled to the window 100. The housing 200 may be coupled to the window 100 to provide an inner space. The display module 300 and the electronic module 400 may be accommodated in the inner space.

The housing 200 may have a material with a relatively high rigidity. For example, the housing 200 may include a glass, plastic, or metal material or frames and/or plates of combinations thereof. The housing 200 may stably protect the components of the electronic device 1000 accommodated in the inner space from external impacts.

FIG. 3 is a schematic diagram of an equivalent circuit diagram illustrating the pixel PXij of the display module 300 according to an embodiment. The pixel PXij, a first pixel disposed in the first area A1, and a second pixel disposed in the second area A2 have a difference only in size, and thus, the equivalent circuit diagram of the pixel PXij may be applied to the first pixel and the second pixel.

FIG. 3 shows the pixel PXij connected to an i-th scan line SLi among scan lines SL1 to SLn of a first group and a j-th data line DLj among data lines DL1 to DLm.

In an embodiment, a pixel driving circuit may include first to seventh transistors T1 to T7 and a capacitor Cst. In an embodiment, each of first, second, third, fourth, fifth, sixth, and seventh transistors T1 to T7 will be described as a P-type transistor, however, the embodiments are not limited thereto. The transistors T1 to T7 may be implemented by a P-type transistor or an N-type transistor.

In an embodiment, at least one of the transistors T1 to T7 may be omitted. At least one of the transistors T1 to T7 may include a semiconductor layer containing oxide, and the other of the transistors T1 to T7 may include a semiconductor layer containing silicon.

The first transistor T1 may be a driving transistor, and the second transistor T2 may be a switching transistor. The capacitor Cst may be electrically connected between a first power line PL to which a first power supply voltage ELVDD is applied and a reference node RD. The capacitor Cst may include a first electrode Cst1 electrically connected to the reference node RD and a second electrode Cst2 electrically connected to the first power line PL.

The first transistor T1 may be electrically connected between the first power line PL and an electrode of a light emitting diode OLED. A source S1 of the first transistor T1 may be electrically connected to the first power line PL. Another transistor may be disposed between the source S1 of the first transistor T1 and the first power line PL or a pre-arranged transistor may be omitted between the source S1 of the first transistor T1 and the first power line PL.

In the disclosure, the expression "a transistor is electrically connected to a signal line, or a transistor is electrically connected to another transistor" means that a source, a drain, or a gate of the transistor may be integrally formed with that of another transistor or the signal line, or the source, the drain, or the gate of the transistor is electrically connected to that of another transistor or the signal line via a connection electrode.

A drain D1 of the first transistor T1 may be electrically connected to an anode of the light emitting diode OLED. Another transistor may be disposed between the drain D1 of the first transistor T1 and the anode of the light emitting diode OLED, or a pre-arranged transistor may be omitted between the drain D1 of the first transistor T1 and the anode of the light emitting diode OLED. A gate G1 of the first transistor T1 may be electrically connected to the reference node RD.

The second transistor T2 may be electrically connected between the j-th data line DLj and the source S1 of the first transistor T1. A source S2 of the second transistor T2 may be electrically connected to the j-th data line DLj, and a drain D2 of the second transistor T2 may be electrically connected to the source S1 of the first transistor T1. In an embodiment, a gate G2 of the second transistor T2 may be electrically connected to the i-th scan line SLi of the first group.

The third transistor T3 may be electrically connected between the reference node RD and the drain D1 of the first transistor T1. A drain D3 of the third transistor T3 may be electrically connected to the drain D1 of the first transistor T1, and a source S3 of the third transistor T3 may be electrically connected to the reference node RD. In an embodiment, a gate G3 of the third transistor T3 may be electrically connected to an i-th scan line GLi of a second group.

The fourth transistor T4 may be electrically connected between the reference node RD and a second power line RL. A drain D4 of the fourth transistor T4 may be electrically connected to the reference node RD, and a source S4 of the fourth transistor T4 may be electrically connected to the second power line RL. In an embodiment, a gate G4 of the fourth transistor T4 may be electrically connected to an i-th scan line HLi of a third group.

The fifth transistor T5 may be electrically connected between the first power line PL and the source S1 of the first transistor T1. A source S5 of the fifth transistor T5 may be electrically connected to the first power line PL, and a drain D5 of the fifth transistor T5 may be electrically connected to the source S1 of the first transistor T1. A gate G5 of the fifth transistor T5 may be electrically connected to an i-th light emitting line ELi.

The sixth transistor T6 may be electrically connected between the drain D1 of the first transistor T1 and the light emitting diode OLED. A source S6 of the sixth transistor T6 may be electrically connected to the drain D1 of the first transistor T1, and a drain D6 of the sixth transistor T6 may be electrically connected to the anode of the light emitting diode OLED. A gate G6 of the sixth transistor T6 may be electrically connected to the i-th light emitting line ELi.

The seventh transistor T7 may be electrically connected between the drain D6 of the sixth transistor T6 and the second power line RL. A source S7 of the seventh transistor T7 may be electrically connected to the drain D6 of the sixth transistor T6, and a drain D7 of the seventh transistor T7 may be electrically connected to the second power line RL.

A gate G7 of the seventh transistor T7 may be electrically connected to an (i+1)th scan line SLi+1 of the first group.

Figure 4:
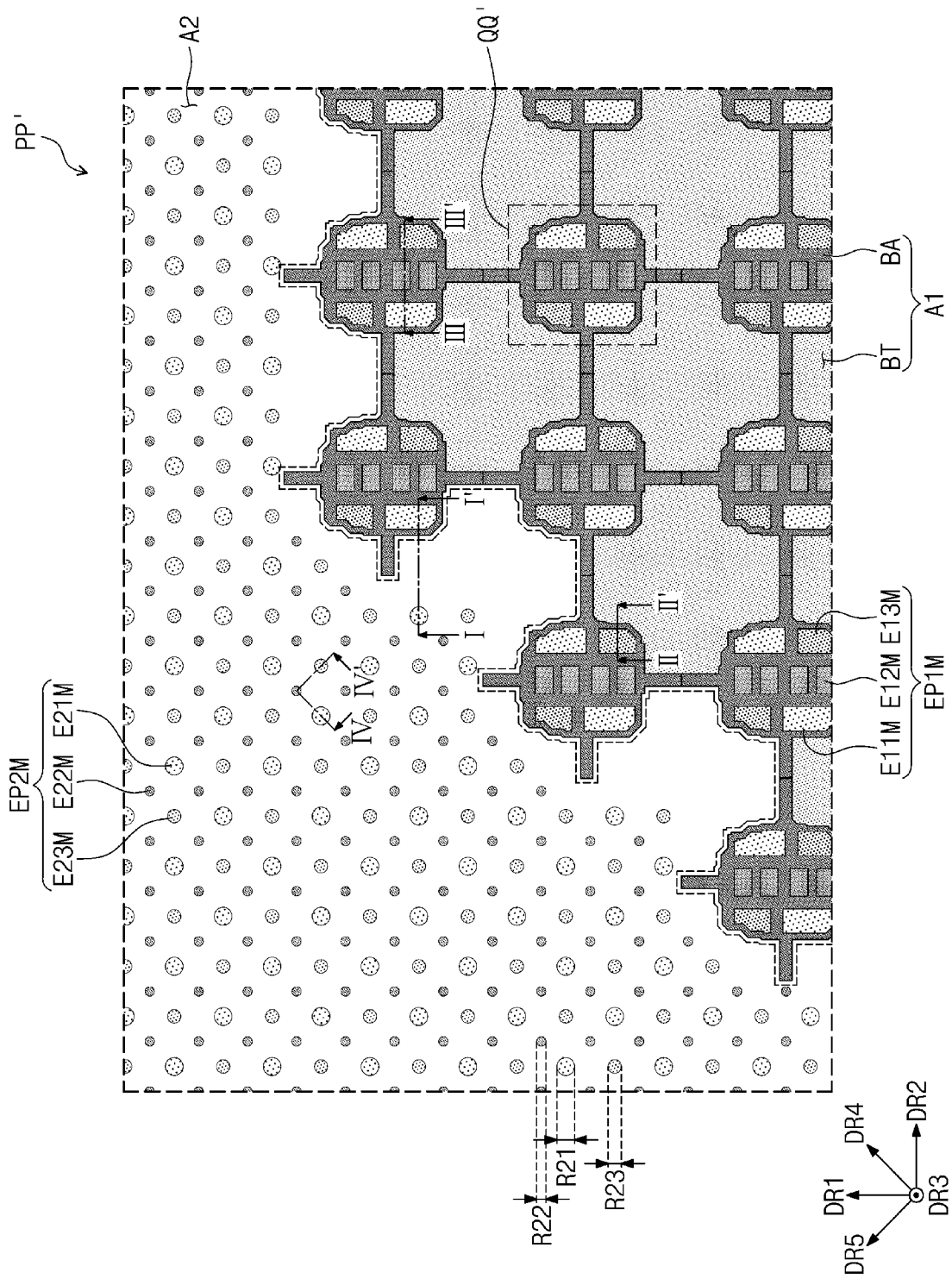
FIG. 4 is an enlarged schematic plan view showing an area PP' of FIG. 2A.
Figure 5A:
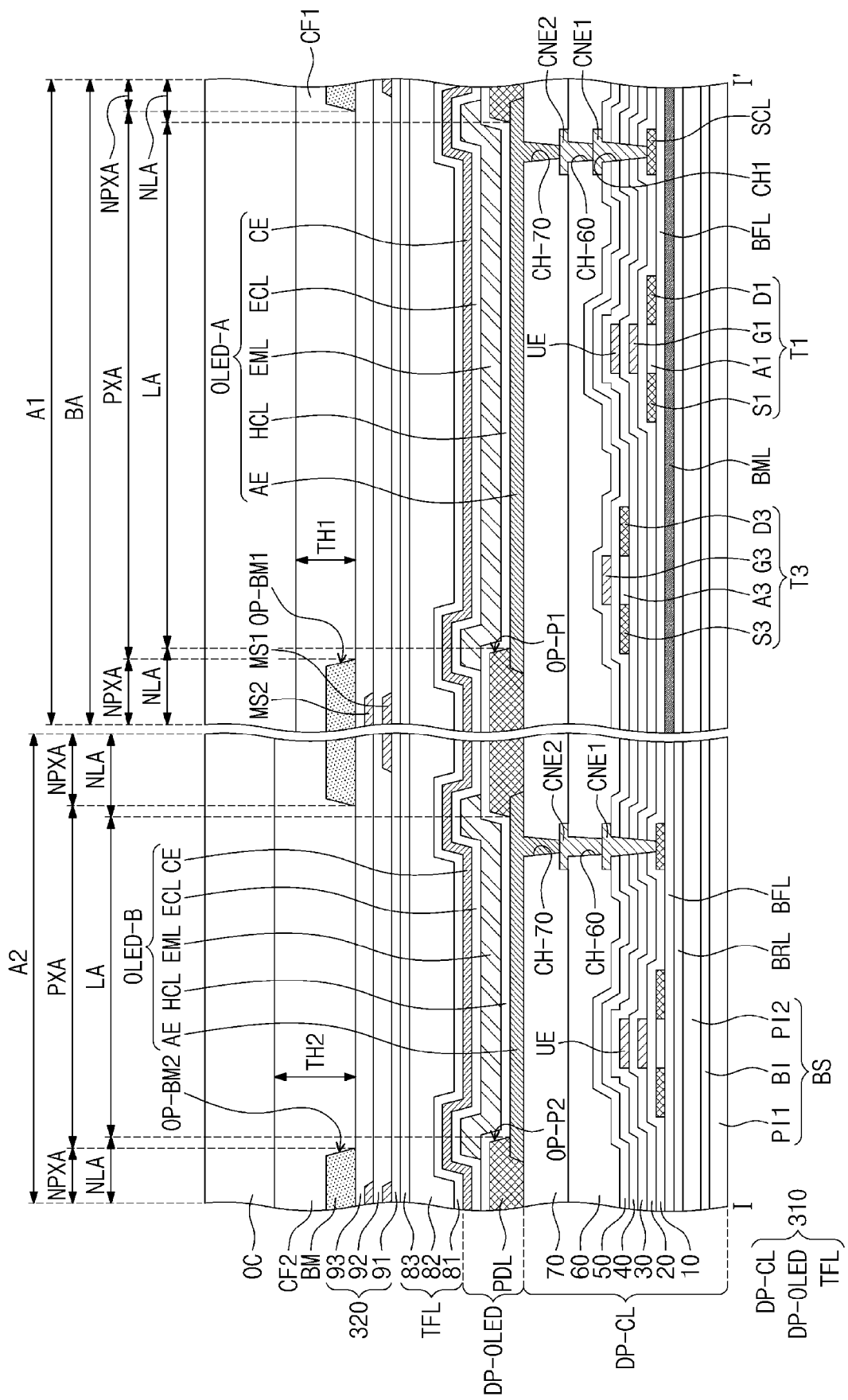
FIG. 5A is a schematic cross-sectional view taken along a line I-I' shown in FIG. 4.
Figure 5B:
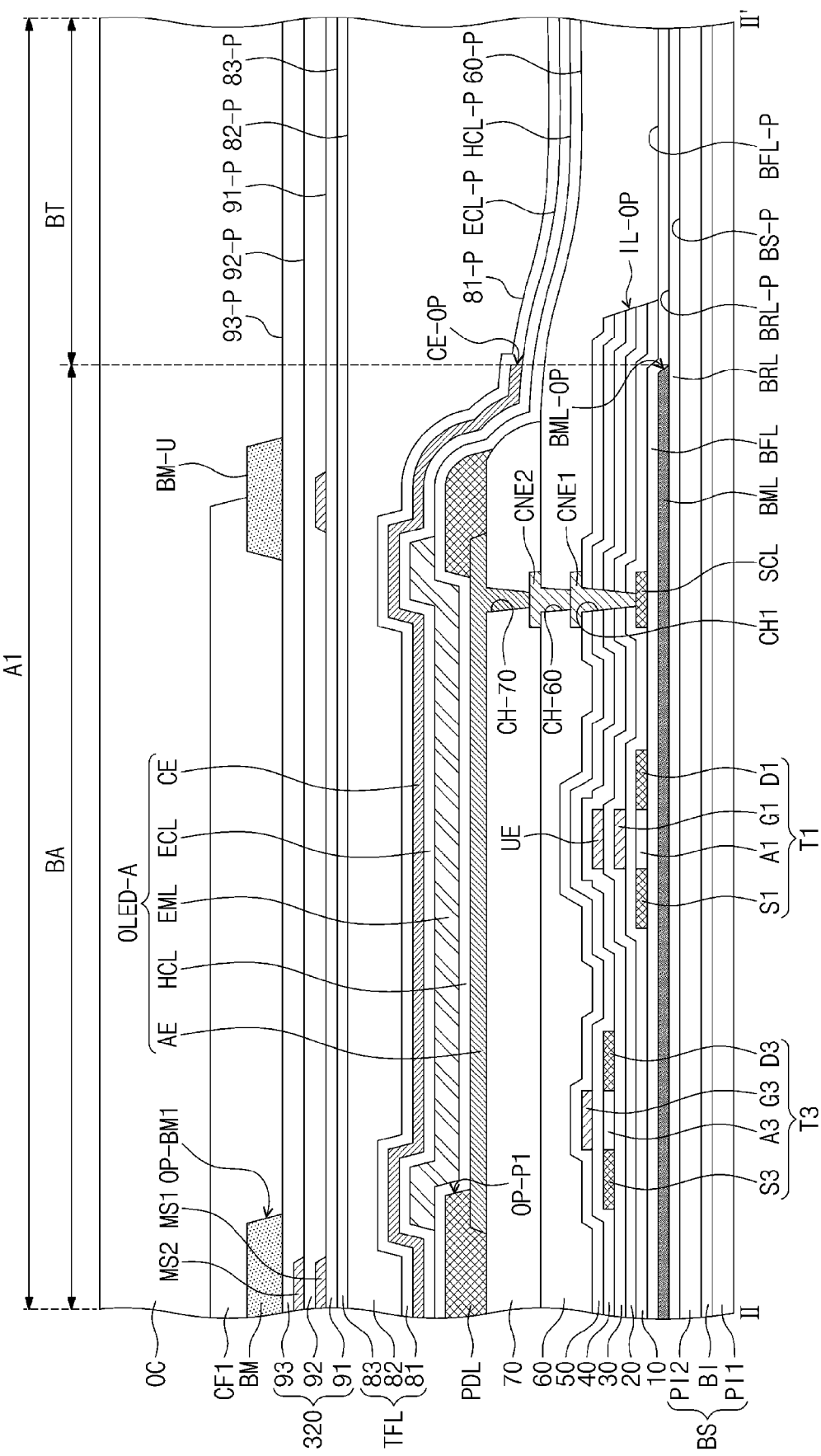
FIG. 5B is a schematic cross-sectional view taken along a line II-II' shown in FIG. 4.

FIG. 4 is an enlarged schematic plan view showing an area PP' of FIG. 2A. FIG. 5A is a schematic cross-sectional view taken along a line I-I' shown in FIG. 4. FIG. 5B is a schematic cross-sectional view taken along a line II-II' shown in FIG. 4.

Referring to FIG. 4, the display area DA (refer to FIG. 2A) of the display module 300 (refer to FIG. 2A) may include the first area A1 and the second area A2. The display module 300 may include a first pixel EP1M disposed in the first area A1 and a second pixel EP2M disposed in the second area A2. The first pixel EP1M and the second pixel EP2M may have different light emission sizes from each other, and the first pixel EP1M and the second pixel EP2M may be arranged in different arrangements from each other.

There may be multiple first pixels EP1M provided (or disposed) in the first area A1, and the first pixels EP1M may be arranged to be spaced apart from each other in the first direction DR1 and the second direction DR2. The first pixel EP1M may include sub-pixels E11M, E12M, and E13M. According to an embodiment, the first pixel EP1M may include first-first sub-pixels E11M, first-second sub-pixels E12M, and first-third sub-pixels E13M.

The first-first sub-pixels E11M may be spaced apart from each other with the first-second sub-pixels E12M interposed between them in second direction DR2, and two first-first sub-pixels E11M spaced apart from each other may be arranged in a diagonal direction along a fourth direction DR4. In an embodiment, the first-first sub-pixels E11M may emit a blue light.

The first-second sub-pixels E12M may be disposed between the first-first sub-pixels E11M and the first-third sub-pixels E13M. In an embodiment, four first-second sub-pixels E12M may be arranged in the first direction DR1 and may be spaced apart from each other. According to the embodiment, the first-second sub-pixels E12M may emit a green light.

The first-third sub-pixels E13M may be spaced apart from each other with the first-second sub-pixels E12M interposed therebetween in the second direction DR2, and two first-third sub-pixels E13M spaced apart from each other may be arranged in a diagonal direction along a fifth direction DR5. In an embodiment, the first-third sub-pixels E13M may emit a red light.

In an embodiment, a first-third sub-pixel E13M disposed at a left side with respect to the first-second sub-pixels E12M may be disposed above a first-first sub-pixel E11M in the first direction DR1, and the other first-third sub-pixel E13M disposed at a right side with respect to the first-second sub-pixels E12M may be disposed below the other first-first sub-pixel E11M in the first direction DR1.

A light emission size of each of the sub-pixels E11M, E12M, and E13M disposed in the first area A1 may increase in the order of the first-second sub-pixel E12M, the first-third sub-pixel E13M, and the first-first sub-pixel E11M.

The second pixel EP2M may include sub-pixels E21M, E22M, and E23M. The second pixel EP2M may include a second-first sub-pixel E21M, second-second sub-pixels E22M, and a second-third sub-pixel E23M. The second pixel EP2M may include at least one of each of the sub-pixels E21M, E22M, and E23M. For example, the second pixel EP2M may include two second-second sub-pixels E22M, one second-first sub-pixel E21M, and one second-third sub-pixel E23M.

The second-first, second-second, and second-third sub-pixels E21M, E22M, and E23M may be spaced apart from each other in the first direction DR1 and the second direction DR2. The second-first, second-second, and second-third sub-pixels E21M, E22M, and E23M may be substantially arranged in a lozenge shape. In an embodiment, an arrangement structure of the sub-pixels E21M, E22M, and E23M disposed in the second area A2 may be a PENTILE™ structure.

The second-second sub-pixels E22M may be spaced apart from each other in the first direction DR1 and the second direction DR2. The second-first sub-pixel E21M may be alternately arranged with the second-third sub-pixel E23M in the first direction DR1 and the second direction DR2. The second-third sub-pixel E23M may be spaced apart from each other in the fourth direction DR4 and the fifth direction DR5 with respect to the second-second sub-pixel E22M, and the second-first sub-pixel E21M may be spaced apart from each other in the fourth direction DR4 and the fifth direction DR5 with respect to the second-second sub-pixel E22M.

According to an embodiment, the second-first sub-pixel E21M may provide the blue light. The second-second sub-pixel E22M may provide the green light. The second-third sub-pixel E23M may provide the red light.

According to an embodiment, each of the second-first, second-second, and second-third sub-pixels E21M, E22M, and E23M may have a circular shape. In the second area A2, diameters of the second-first, second-second, and second-third sub-pixels E21M, E22M, and E23M may increase in the order of a diameter R22 of the second-second sub-pixel E22M, a diameter R23 of the second-third sub-pixel E23M, and a diameter R21 of the second-first sub-pixel E21M. For example, the light emission size of each of the sub-pixels E21M, E22M, and E23M disposed in the second area A2 may increase in the order of the second-second sub-pixel E22M, the second-third sub-pixel E23M, and the second-first sub-pixel E21M.

According to an embodiment, the first area A1 may be divided into a light blocking area BA and a transmission area BT. The light blocking area BA may be an area in which conductive materials for the pixel PXij are patterned. In case that the electronic module 400 (refer to FIG. 2A) receives and transmits a light, the light reflected by the conductive materials may cause the performance of the electronic module 400 to deteriorate.

According to the disclosure, the light blocking layer BML (refer to FIG. 5A) may overlap the light blocking area BA in a plan view. The light blocking layer BML may not to overlap the transmission area BT of the first area A1 in a plan view. Accordingly, the deterioration in the performance of the electronic module 400 described above may be avoided. In FIG. 4, the light blocking area BA where the light blocking layer BML is disposed in the first area A1 is illustrated in a relatively dark color compared with the transmission area BT.

FIG. 5A shows a schematic cross section of the display area DA (refer to FIG. 2A) of the electronic panel EP (refer to FIG. 2A) in the first area A1 and the second area A2. FIG. 5A shows the cross-section along line I-I' of FIG. 4. In FIG. 5A, for convenience of explanation, the cross-section near a border of the first area A1 and the second area A2 is omitted. First and third transistors T1 and T3 shown in FIG. 5A may correspond to the first transistor T1 and the third transistor T3, respectively, among the first to seventh transistors T1 to T7 described in FIG. 3.

According to an embodiment, the display module 300 (refer to FIG. 2A) may include the display panel 310, the input sensor 320, a black matrix BM, color filter layers CF1 and CF2, and an overcoat layer OC.

The display panel 310 may include a circuit element layer DP-CL, a display element layer DP-OLED, and a thin film encapsulation layer TFL. The display panel 310 may further include functional layers such as an anti-reflective layer and a refractive index control layer.

The circuit element layer DP-CL may include insulating layers and circuit elements. Hereinafter, the insulating layers may include an organic layer and/or an inorganic layer. In an embodiment, the insulating layers may include inorganic insulating layers including first, second, third, fourth, and fifth insulating layers 10, 20, 30, 40, and 50 and at least one organic insulating layer disposed on the inorganic insulating layers. According to an embodiment, the organic insulating layer may include a sixth insulating layer 60 and a seventh insulating layer 70 disposed on the sixth insulating layer 60. However, some insulating layers among the first to seventh insulating layers 10 to 70 may be omitted, and other insulating layers may be further added. The stacking order of the inorganic insulating layers and the organic insulating layers is not limited.

An insulating layer, a semiconductor layer, and a conductive layer of the circuit element layer DP-CL may be formed by a coating or depositing process. The insulating layer, the semiconductor layer, and the conductive layer may be selectively patterned by a photolithography process. Thus, a semiconductor pattern, a conductive pattern, and a signal line may be formed.

The circuit element layer DP-CL may include a base layer BS. The base layer BS may serve as a base layer on which the other components of the circuit element layer DP-CL are disposed. The base layer BS may include organic material layers and inorganic material layers that are alternately stacked with each other. For example, the base layer BS may include a first base layer PI1, a first barrier layer BI, and a second base layer PI2.

The first base layer PI1 may include an organic material. For example, the first base layer PI1 may include one of polyimide (PI), polyethylene naphthalate (PEN), polyethylene terephthalate (PET), polyarylate, polycarbonate (PC), polyetherimide (PEI), and polyethersulfone (PES).

The first barrier layer BI may be disposed on the first base layer PI1. The first barrier layer BI may include an inorganic material. For example, the first barrier layer BI may include at least one of silicon oxide, silicon oxynitride, aluminum oxide, titanium oxide, silicon nitride, zirconium oxide, and hafnium oxide.

The second base layer PI2 may be disposed on the first barrier layer BI. The second base layer PI2 may include an organic material. The first base layer BI1 and the second base layer PI2 may include the same organic material.

In other examples, the base layer BS may be provided as a single-layer structure. The base layer BS may include a synthetic resin layer. The synthetic resin layer may include a heat-curable resin. The synthetic resin layer may be a polyimide-based resin layer. However, the embodiments are not limited by the material for the synthetic resin layer. The base layer BS may include a glass, metal, or organic/inorganic composite material.

A second barrier layer BRL may be disposed on the base layer BS. The second barrier layer BRL may include an inorganic material. For example, the second barrier layer BRL may include at least one of silicon oxide, aluminum oxide, titanium oxide, silicon nitride, silicon oxynitride, zirconium oxide, and hafnium oxide.

A buffer layer BFL may be disposed on the second barrier layer BRL. The buffer layer BFL may improve an adhesive force between the second barrier layer BRL and the semiconductor pattern and/or between the second barrier layer BRL and the conductive pattern. The buffer layer BFL may include at least one of silicon oxide and silicon nitride. The buffer layer BFL may have a single-layer or multi-layer structure of silicon oxynitride; however, it should not be limited thereto or thereby.

The semiconductor pattern may be disposed on the buffer layer BFL. Hereinafter, the semiconductor pattern disposed directly on the buffer layer BFL may be defined as a first semiconductor pattern. The first semiconductor pattern may include silicon semiconductors. The first semiconductor pattern may include polysilicon, but the embodiments are not limited thereto. According to an embodiment, the first semiconductor pattern may include amorphous silicon.

FIG. 5A shows a portion of the first semiconductor pattern, and the first semiconductor pattern may be further disposed in another area of the pixel PXij (refer to FIG. 3). The first semiconductor pattern may have different electrical properties depending on whether it is doped or not, and whether it is doped with an N-type dopant or a P-type dopant. The first semiconductor pattern may include a doped region and a non-doped region. The doped region may be doped with the N-type dopant or the P-type dopant. The P-type transistor may include the doped region doped with the P-type dopants.

The source S1, an active A1, and the drain D1 of the first transistor T1 may be formed from the first semiconductor pattern. The source S1 and the drain D1 may be spaced apart from each other with the active A1 interposed between them.

A connection signal line SCL may be disposed on the buffer layer BFL. The connection signal line SCL may be electrically connected to the drain D6 of the sixth transistor T6 (refer to FIG. 3) when viewed in a plan view.

The first insulating layer 10 may be disposed on the buffer layer BFL and may cover the first semiconductor pattern and the connection signal line SCL. The first insulating layer 10 may be an inorganic layer and/or an organic layer and may have a single-layer or multi-layer structure. The first insulating layer 10 may include at least one of aluminum oxide, titanium oxide, silicon oxide, silicon nitride, silicon oxynitride, zirconium oxide, and hafnium oxide.

Other insulating layers of the circuit element layer DP-CL, to be described below, may include an inorganic layer and/or an organic layer and may have a single-layer or multi-layer structure. The inorganic layer may include at least one of the materials mentioned above.

The gate G1 of the first transistor T1 may be disposed on the first insulating layer 10. The gate G1 may be a portion of a metal pattern. The gate G1 of the first transistor T1 may overlap the active A1 of the first transistor T1. The gate G1 of the first transistor T1 may be used as a mask in a process of doping the first semiconductor pattern.

The second insulating layer 20 may be disposed on the first insulating layer 10 and may cover the gate G1. The second insulating layer 20 may include an inorganic layer and/or an organic layer and may have a single-layer or multi-layer structure. In an embodiment, the second insulating layer 20 may have a single-layer structure including a silicon nitride layer.

An upper electrode UE may be disposed on the second insulating layer 20. The upper electrode UE may overlap the gate G1 in a plan view. The upper electrode UE may be a portion of a metal pattern or a portion of the doped semiconductor pattern. A portion of the gate G1 and the upper electrode UE overlapping the portion of the gate G1 may define the capacitor Cst (refer to FIG. 3).

Although not shown in figures, the first electrode Cst1 (refer to FIG. 3) and the second electrode Cst2 (refer to FIG. 3) of the capacitor Cst (refer to FIG. 3) may be formed through the same process as those of the gate G1 and the upper electrode UE. The first electrode Cst1 may be disposed on the first insulating layer 10. The first electrode Cst1 may be electrically connected to the gate G1. The first electrode Cst1 and gate G1 may be integral with each other.

The third insulating layer 30 may be disposed on the second insulating layer 20 and may cover the upper electrode UE. In an embodiment, the third insulating layer 30 may include silicon oxide layers and silicon nitride layers alternately stacked with the silicon oxide layers. Although not shown in figures, the sources S2, S5, S6, and S7 (refer to FIG. 3), the drains D2, D5, D6, and D7 (refer to FIG. 3), and the gates G2, G5, G6, and G7 (refer to FIG. 3) of the second, fifth, sixth, and seventh transistors T2, T5, T6, and T7 (refer to FIG. 3) may be formed through the same processes as those of the source S1, the drain D1, and the gate G1 of the first transistor T1, respectively.

The semiconductor pattern may be disposed on the third insulating layer 30. Hereinafter, the semiconductor pattern disposed directly on the third insulating layer 30 may be defined as a second semiconductor pattern. The second semiconductor pattern may include metal oxides. The oxide semiconductor may include a crystalline oxide semiconductor or an amorphous oxide semiconductor.

For example, the oxide semiconductor may include metal oxides of metals, such as zinc (Zn), indium (In), gallium (Ga), tin (Sn), titanium (Ti), and etc. The oxide semiconductor may include a mixture of the metals, such as zinc (Zn), indium (In), gallium (Ga), tin (Sn), titanium (Ti), etc., and oxides of such metals. For example, the oxide semiconductor may include indium-tin oxide (ITO), indium-gallium-zinc oxide (IGZO), zinc oxide (ZnO), indium-zinc oxide (IZnO), zinc-indium oxide (ZIO), indium oxide (InO), titanium oxide (TiO), indium-zinc-tin oxide (IZTO), zinc-tin oxide (ZTO), or the like.

As shown in FIG. 5A, the source S3, an active A3, and the drain D3 of the third transistor T3 may be formed from the second semiconductor pattern. The source S3 and the drain D3 may include a metal reduced from a metal oxide semiconductor. The source S3 and the drain D3 may include a metal layer having a selected thickness from an upper surface of the second semiconductor pattern and including the reduced metal.

Although not shown in FIG. 5A, the second semiconductor pattern may be disposed on the third insulating layer 30 of the second area A2.

The fourth insulating layer 40 may be disposed on the third insulating layer 30 to cover the second semiconductor pattern. In an embodiment, the fourth insulating layer 40 may have a single-layer structure of a silicon oxide layer. The gate G3 of the third transistor T3 may be disposed on the fourth insulating layer 40. The gate G3 may be a portion of the metal pattern. The gate G3 of the third transistor T3 may overlap the active A3 of the third transistor T3 in a plan view.

The fifth insulating layer 50 may be disposed on the fourth insulating layer 40 and cover the gate G3 of the third transistor T3. In an embodiment, the fifth insulating layer 50 may include a silicon oxide layer and a silicon nitride layer. The fifth insulating layer 50 may include silicon oxide layers and silicon nitride layers alternately staked with the silicon oxide layers.

Although not shown in figures, the source S4 (refer to FIG. 3), the drain D4 (refer to FIG. 3), and the gate G4 (refer to FIG. 3) of the fourth transistor T4 (refer to FIG. 3) may be formed through the same process as those of the source S3, the drain D3, and the gate G3 of the third transistor T3, respectively.

At least one insulating layer may be further disposed on the fifth insulating layer 50. According to the embodiment, the sixth insulating layer 60 and the seventh insulating layer 70 may be disposed on the fifth insulating layer 50. Each of the sixth insulating layer 60 and the seventh insulating layer 70 may be an organic layer and may have a single-layer or multi-layer structure. Each of the sixth insulating layer 60 and the seventh insulating layer 70 may have a single-layer structure of a polyimide-based resin layer. However, the embodiments are not limited thereto.

In other examples, each of the sixth insulating layer 60 and the seventh insulating layer 70 may include at least one of an acrylate-based resin, a methacrylate-based resin, a polyisoprene-based resin, a vinyl-based resin, an epoxy-based resin, a urethane-based resin, a cellulose-based resin, a siloxane-based resin, a polyamide-based resin, and a perylene-based resin.

A first connection electrode CNE1 may be disposed on the fifth insulating layer 50. The first connection electrode CNE1 may be electrically connected to the connection signal line SCL via a first contact hole CHI defined through the first to fifth insulating layers 10 to 50.

A second connection electrode CNE2 may be disposed on the sixth insulating layer 60. The second connection electrode CNE2 may be electrically connected to the first connection electrode CNE1 via a second contact hole CH-60 defined through the sixth insulating layer 60. The seventh insulating layer 70 may be disposed on the sixth insulating layer 60 and may cover the second connection electrode CNE2.

Light emitting diodes OLED-A and OLED-B may be disposed on the seventh insulating layer 70. The light emitting diodes OLED-A and OLED-B may include a first electrode AE, a hole control layer HCL, a light emitting layer EML, an electron control layer ECL, and a second electrode CE.

The first electrode AE may be disposed on the seventh insulating layer 70. The first electrode AE may be electrically connected to the second connection electrode CNE2 via a third contact hole CH-70 defined through the seventh insulating layer 70. A pixel definition layer PDL may be disposed on the seventh insulating layer 70.

According to the embodiment, the pixel definition layer PDL may be disposed in the light blocking area BA of the first area A1 and the second area A2. The pixel definition layer PDL disposed in the first area A1 may include a first light emitting opening OP-P1 that exposes at least a portion of the first electrode AE of light emitting diode OLED-A through the pixel definition layer PDL. The pixel definition layer PDL disposed in the second area A2 may include a second light emitting opening OP-P2 that exposes at least a portion of the first electrode AE of light emitting diode OLED-B through the pixel definition layer PDL.

The first light emitting opening OP-P1 of the pixel definition layer PDL may define a light emitting area LA in the first area A1, and the second light emitting opening OP-P2 of the pixel definition layer PDL may define a light emitting area LA in the second area A2. A non-light-emitting area NLA may be defined adjacent to the light emitting area LA, may defined as a remaining area excluding the light emitting area LA, and may surround the light emitting area LA.

According to an embodiment, the pixel definition layer PDL may absorb light. For example, the pixel definition layer PDL may have a black color. The pixel definition layer PDL may include a black coloring agent. The black coloring agent may include a black dye or a black pigment. The black coloring agent may include a metal material, such as carbon black, chromium, or oxides of these materials.

The hole control layer HCL may be disposed in both the light emitting area LA and the non-light-emitting area NLA. A common layer such as the hole control layer HCL may be commonly formed over the pixels PXij. The hole control layer HCL may include a hole transport layer and a hole injection layer.

The light emitting layer EML may be disposed on the hole control layer HCL. The light emitting layer EML may be disposed only in areas corresponding to the first and second light emitting openings OP-P1 and OP-P2. The light emitting layer EML may be formed in each of the pixels PXij after being divided into multiple portions.

In an embodiment, a patterned light emitting layer EML is shown as an example, however, the light emitting layer EML may be commonly disposed over the pixels PXij. The light emitting layer EML may generate a white light or a blue light when it is commonly disposed over the pixels PXij. In other examples, the light emitting layer EML may have a multi-layer structure.

The electron control layer ECL may be disposed on the light emitting layer EML. The electron control layer ECL may include an electron transport layer and an electron injection layer. The second electrode CE may be disposed on the electron control layer ECL. The electron control layer ECL and the second electrode CE may be commonly disposed in the pixels PXij.

In the first area A1, the first to seventh transistors T1 to T7 (refer to FIG. 3) connected to the light emitting diode OLED-A and the light emitting diode OLED-A may form a first pixel EP1M (refer to FIG. 4).

In the second area A2, the first to seventh transistors T1 to T7 connected to the light emitting diode OLED-B and the light emitting diode OLED-B may form a second pixel EP2M (refer to FIG. 4).

The thin film encapsulation layer TFL may be disposed on the second electrode CE. The thin film encapsulation layer TFL may be commonly disposed over the pixels PXij. In an embodiment, the thin film encapsulation layer TFL may directly cover the second electrode CE.

The thin film encapsulation layer TFL may include a first inorganic layer 81, an organic layer 82, and a second inorganic layer 83, however, it should not be limited thereto or thereby. According to an embodiment, the thin film encapsulation layer TFL may further include inorganic layers and organic layers.

The first inorganic layer 81 may contact the second electrode CE. The first inorganic layer 81 may prevent external moisture or oxygen from entering the light emitting layer EML. For example, the first inorganic layer 81 may include silicon nitride, silicon oxide, or a combination thereof. The first inorganic layer 81 may be formed through a deposition process.

The organic layer 82 may be disposed on the first inorganic layer 81 and may contact the first inorganic layer 81. The organic layer 82 may provide a flat surface on the first inorganic layer 81. An uneven shape formed on an upper surface of the first inorganic layer 81 or particles existing on the first inorganic layer 81 may be covered by the organic layer 82. Thus, the organic layer 82 prevents the surface state of the upper surface of the first inorganic layer 81 from affecting components formed on the organic layer 82. The organic layer 82 may include an organic material and may be formed by a solution process, such as spin coating, slit coating, or an inkjet process.

The second inorganic layer 83 may be disposed on the organic layer 82 to cover the organic layer 82. The second inorganic layer 83 may be stably formed on a relatively flat surface compared with a case in which the second inorganic layer 83 is disposed on the first inorganic layer 81. The second inorganic layer 83 may encapsulate moisture leaked from the organic layer 82 to prevent the moisture from flowing to the outside. The second inorganic layer 83 may include silicon nitride, silicon oxide, or a compound of these materials. The second inorganic layer 83 may be formed by a deposition process.

The input sensor 320 may be disposed directly on the thin film encapsulation layer TFL. The input sensor 320 may include conductive patterns MS1 and MS2 and one or more sensing insulating layers 91, 92, and 93. According to an embodiment, the sensing insulating layers 91, 92, and 93 may include a first sensing insulating layer 91, a second sensing insulating layer 92, and a third sensing insulating layer 93. Each of the first sensing insulating layer 91, the second sensing insulating layer 92, and the third sensing insulating layer 93 may include at least one of an inorganic material and an organic material.

The first sensing insulating layer 91 may be disposed on the thin film encapsulation layer TFL. First conductive patterns MS1 may be disposed on the first sensing insulating layer 91 and may be covered by the second sensing insulating layer 92. Second conductive patterns MS2 may be disposed on the second sensing insulating layer 92 and may be covered by the third sensing insulating layer 93.

Each of the first and second conductive patterns MS1 and MS2 may have conductivity. Each of the first and second conductive patterns MS1 and MS2 may have a single-layer structure or a multi-layer structure, but the embodiments are not particularly limited to such structures. At least one of the first conductive patterns MS1 and the second conductive patterns MS2 may be provided as mesh lines when viewed in a plan view.

The mesh lines forming the conductive patterns MS1 and MS2 may be spaced apart from the light emitting layer EML when viewed in a plan view. Accordingly, although the input sensor 320 is directly formed on the display panel 310, the light generated by the pixels PXij (refer to FIG. 2B) of the display panel 310 may be viewed by the user without interference from the input sensor 320.

The black matrix BM may be disposed on the third sensing insulating layer 93. The black matrix BM may overlap the conductive patterns. Accordingly, the black matrix BM may prevent external light from being reflected by the conductive patterns. The material for the black matrix BM may not be particularly limited as long as the material absorbs light. According to an embodiment, the black matrix BM may have a black color. The black matrix BM may include a black coloring agent. The black coloring agent may include a black dye or a black pigment. The black coloring agent may include a metal material, such as carbon black, chromium, or oxides of such materials.

FIG. 5A shows a structure in which the black matrix BM is disposed on the third sensing insulating layer 93, however, the disclosure is not limited thereto. For example, the third sensing insulating layer 93 of the input sensor 320 may be omitted, and the black matrix BM may be disposed on the second sensing insulating layer 92 to cover the second conductive patterns MS2.

The black matrix BM may have openings. The openings may include a first light blocking opening OP-BM1 defined in the first area A1 and a second light blocking opening OP-BM2 defined in the second area A2. The first light blocking opening OP-BM1 of the black matrix BM may overlap the corresponding first light emitting opening OP-P1 of the pixel definition layer PDL. The second light blocking opening OP-BM2 of the black matrix BM may overlap the corresponding second light emitting opening OP-P2 of the pixel definition layer PDL.

Each of the first light blocking opening OP-BM1 and the second light blocking opening OP-BM2 of the black matrix BM may define a pixel area PXA. The pixel area PXA may be defined as an area from which the light generated by the light emitting diodes OLED-A and OLED-B are emitted to the outside. As the size of the pixel area PXA increases, the luminance of the image may increase. A non-pixel area NPXA may be defined adjacent to the pixel area PXA and may be defined as the remaining area excluding the pixel area PXA, and the non-pixel area NPXA may surround the pixel area PXA.

In the first area A1, the width of the cross-section of the first light blocking opening OP-BM1 of the black matrix BM may be greater than the width of the corresponding first light emitting opening OP-P1 of the pixel definition layer PDL. In the second area A2, the width in the cross-section of the second light blocking opening OP-BM2 of the black matrix BM may be greater than the width of the corresponding second light emitting opening OP-P2 of the pixel definition layer PDL.

In a plan view, the size of the first light blocking opening OP-BM1 of the black matrix BM may be greater than the size of the corresponding first light emitting opening OP-P1 of the pixel definition layer PDL. In a plan view, the size of the second light blocking opening OP-BM2 of the black matrix BM may be greater than the size of the corresponding second light emitting opening OP-P2 of the pixel definition layer PDL.

The color filter layers CF1 and CF2 may be disposed on the third sensing insulating layer 93 and may cover the black matrix BM. The color filter layers CF1 and CF2 may selectively transmit the light provided from the light emitting layer EML.

According to the embodiment, the color filter layers CF1 and CF2 may include a first color filter layer CF1 overlapping the first area A1 and a second color filter layer CF2 overlapping the second area A2.

According to the disclosure, the first color filter layer CF1 may have a first thickness TH1 in the cross-sectional view. The second color filter layer CF2 may have a second thickness TH2 in the cross-sectional view. In the disclosure, the thickness of the color filter layer may be defined by a distance from a surface of the color filter layer contacting the third sensing insulating layer 93, to the other surface of the color filter layer, which may be the opposite surface in the thickness direction. The thickness of each of the color filter layers CF1 and CF2 may be the thickness of a color filter layer in an area overlapping the pixel area PXA. For example, the thickness of the color filter layer may be a minimum thickness in the area overlapping the pixel area PXA.

According to the disclosure, the first thickness TH1 of the first color filter layer CF1 may be smaller than the second thickness TH2 of the second color filter layer CF2. The first thickness TH1 may have a value of about 60% to about 90% of the second thickness TH2.

According to the disclosure, as the thickness of the color filter layer is different in the first and second areas A1 and A2, the luminance lifetime of the light provided from the display panel 310 may be controlled. In the disclosure, the luminance lifetime means a time during which the luminance is maintained within a range from about 90% to about 97% of the luminance value that is first measured in the display panel 310 when the display panel 310 is manufactured.

The luminance lifetime is inversely proportional to the current density. Thus, the luminance lifetime may depend on the size of the light emitting openings OP-P1 and OP-P2. The luminance lifetime also depends on the light transmittance of the color filter layers CF1 and CF2. In the disclosure, the transmission area BT (refer to FIG. 4) of the first area A1 is set according to the requirements of the camera of the product to perform. The light blocking area BA may be defined as the remaining area excluding the previously set transmission area BT. Therefore, in the first area A1, there is a limit to how much the size of the light emitting openings OP-P1 may be increased in the light blocking area BA.

Accordingly, according to the disclosure, as the first thickness TH1 of the first color filter layer CF1 disposed in the first area A1 is reduced, the transmittance with respect to the light provided through the first light emitting opening OP-P1 may increase, and thus, the luminance lifetime may be improved without increasing the size of the first light emitting opening OP-P1.

Where there is no difference in thickness between the first and second color filter layers CF1 and CF2, the luminance lifetime of the first area A1 may be different from the luminance lifetime of the second area A2. According to the disclosure, as the relatively lower luminance lifetime of the first area A1 increases, the luminance lifetime in the first area A1 and the luminance lifetime in the second area A2 may become substantially similar, and a display quality of the electronic device 1000 (refer to FIG. 1) may be improved.

According to an embodiment, the difference between the first thickness TH1 and the second thickness TH2 may be equal to or greater than about 0.3 micrometers and equal to or smaller than about 1.5 micrometers. When the difference between the first thickness TH1 and the second thickness TH2 is smaller than about 0.3 micrometers, the difference in light transmittance between the first color filter layer CF1 and the second color filter layer CF2 may not be sufficient to reduce the difference in the luminance lifetime between the first and second areas A1 and A2. This may also apply when the first thickness TH1 has a value greater than about 90% of the second thickness TH2.

When the difference between the first thickness TH1 and the second thickness TH2 is greater than about 1.5 micrometers, the first color filter layer CF1 may not function smoothly as the first thickness TH1 becomes thinner. It may also be difficult to perform a deposition process of the second color filter layer CF2 as the second thickness TH2 becomes thicker. This may also apply when the first thickness TH1 has a value smaller than about 60% of the second thickness TH2.

The overcoat layer OC may be disposed on the color filter layers CF1 and CF2 and the black matrix BM. The overcoat layer OC may surround concave and convex portions formed in the process of forming the color filter layers CF1 and CF2 and the black matrix BM to provide a flat surface. The overcoat layer OC may be a planarization layer. The window 100 (refer to FIG. 2A) may be coupled to the flat surface of the overcoat layer OC by an adhesive layer.

According to the embodiment, the light blocking layer BML may be disposed in the light blocking area BA of the first area A1. The light blocking layer BML may overlap the light blocking area BA and may not overlap the transmission area BT of the first area A1. The light blocking layer BML may be disposed between the second barrier layer BRL and the buffer layer BFL.

The light blocking layer BML may serve as a mask pattern when forming the opening CE-OP of the second electrode CE described below in FIG. 5B. For example, a light, such as a laser beam, may be provided to the second electrode CE from the rear surface of the base layer BS. The laser beam may reach a portion of the second electrode CE after passing through an opening BML-OP (refer to FIG. 5B below) of the light blocking layer BML. The portion of the second electrode CE may be removed by the light (the laser beam) provided through the opening BML-OP of the light blocking layer BML. The light blocking layer BML may prevent components disposed on the light blocking layer BML from being damaged by the laser beam.

The light blocking layer BML that may be disposed on the second barrier layer BRL to prevent conductive materials disposed on the base layer BS and the second barrier layer BRL from being recognized as the electronic module 400 (refer to FIG. 2A) due to the external light. Accordingly, although the electronic module 400 is disposed in the display area DA (refer to FIG. 2A), interference with the conductive materials disposed on the base layer BS and the second barrier layer BRL may be reduced, and thus, the performance of the electronic module 400 of the electronic device 1000 may be improved.

Referring to FIG. 5B, the first area A1 may include the light blocking area BA in which the first pixel EP1M is included and the transmission area BT adjacent to the light blocking area BA. The transmission area BT may be defined as an area in which the conductive materials or the insulating layers are patterned or are not deposited to improve the light transmittance.

In an embodiment, the light blocking layer BML, the first insulating layer 10, the second insulating layer 20, the third insulating layer 30, the fourth insulating layer 40, the fifth insulating layer 50, and the seventh insulating layer 70 among the first to seventh insulating layers 10 to 70, which are included in the display panel 310 (refer to FIG. 5A), may not be formed in the transmission area BT or may be patterned away after being deposited. Accordingly, the light blocking layer BML, the first to fifth insulating layers 10 to 50, and the seventh insulating layer 70, which overlap the light blocking area BA, may not overlap the transmission area BT.

A side surface of the light blocking layer BML, which defines the opening BML-OP, may be covered by the buffer layer BFL that is not patterned. The barrier layer BRL exposed through the opening BML-OP of the light blocking layer BML may also be covered by the buffer layer BFL.

The first to fifth insulating layers 10 to 50 may be provided with a transmission opening IL-OP defined (surrounded) by their side surfaces formed through a patterning process, and the side surfaces that define the transmission opening IL-OP may be covered by the sixth insulating layer 60 among the organic insulating layers. The sixth insulating layer 60 may not be patterned away.

In the transmission area BT, the second electrode CE among components of the light emitting diode OLED-A may not be deposited or may be patterned away after being deposited.

According to an embodiment, the hole control layer HCL and the electron control layer ECL may not be patterned and may be disposed to overlap the transmission area BT. A side surface of the second electrode CE, which defines the opening CE-OP, may be covered by the first sensing insulating layer 81.

The black matrix BM and the first color filter layer CF1 may not overlap the transmission area BT. The overcoat layer OC may be disposed on the third sensing insulating layer 93 in the transmission area BT and may contact the third sensing insulating layer 93.

According to the embodiment, the overcoat layer OC may be disposed in the transmission area BT to cover a base layer portion BS-P, a second barrier layer portion BRL-P, a buffer layer portion BFL-P, a sixth insulating layer portion 60-P, a hole control layer portion HCL-P, an electron control layer portion ECL-P, a first inorganic layer portion 81-P, an organic layer portion 82-P, a second inorganic layer portion 83-P, a first sensing insulating layer portion 91-P, a second sensing insulating layer portion 92-P, and a third sensing insulating layer portion 93-P.

The organic layer 82 of the thin film encapsulation layer TFL may have different thicknesses depending on areas to compensate for a step difference between the insulating layers that are not deposited or are patterned after being deposited in the transmission area BT. For example, the thickness of the organic layer 82 in an area overlapping the transmission area BT may be greater than the maximum thickness of the organic layer 82 in areas overlapping the second area A2 and the light blocking area BA.

According to the disclosure, the first area A1 may have a light transmittance higher than that of the second area A2, and the transmission area BT may have the highest light transmittance in the first area A1.

According to an embodiment, a portion of an upper surface BM-U of the black matrix BM adjacent to the transmission area BT may be covered by the first color filter layer CF1. The other portion of the upper surface of the black matrix BM adjacent to the transmission area BT may be exposed without being covered by the first color filter layer CF1 and may be covered by the overcoat layer OC.

FIG. 6A is a schematic cross-sectional view taken along a line III-III' shown in FIG. 4. FIG. 6B is a schematic cross-sectional view taken along a line IV-IV' shown in FIG. 4. FIG. 6A is a schematic cross-sectional view showing the first pixel EP1M included in the first area A1, and FIG. 6B is a schematic cross-sectional view showing the second pixel EP2M included in the second area A2. In FIGS. 6A and 6B, the base layer BS, the barrier layer BRL, the light blocking layer BML, the buffer layer BFL, and the first to sixth insulating layers 10 to 60 of the circuit element layer DP-CL described in FIG. 5A are omitted. Among the components of the first and second pixels EP1M and EP2M, the transistors T1 to T7 (refer to FIGS. 3 and 5A) are omitted. In FIGS. 6A and 6B, the same/similar reference numerals denote the same/similar elements in FIGS. 1 to 5B, and thus, detailed descriptions of the same elements will not be repeated.

As described in FIG. 4, in the light blocking area BA of the first area A1, the first pixel EP1M may include the first-first sub-pixels E11M, the first-second sub-pixels E12M, and the first-third sub-pixels E13M. FIG. 6A shows a schematic cross-section of a first-first sub-pixel E11M, a first-second sub-pixel E12M, and a first-third sub-pixel E13M.

At least a portion of a first electrode AE-B included in the first-first sub-pixel E11M may be exposed through a first-first light emitting opening OP-B1 defined through the pixel definition layer PDL. At least a portion of a first electrode AE-G included in the first-second sub-pixel E12M may be exposed through a first-second light emitting opening OP-G1 defined through the pixel definition layer PDL. At least a portion of a first electrode AE-R included in the first-third sub-pixel E13M may be exposed through a first-third light emitting opening OP-R1 defined through the pixel definition layer PDL.

According to an embodiment, when viewed in cross section, the width of the first-third light emitting opening OP-R1 may be greater than a width of the first-first light emitting opening OP-B1 and may be smaller than a width of the first-second light emitting opening OP-G1, however, the embodiments are not limited thereto. According to an embodiment, the widths of the first-first, first-second, and first-third light emitting openings OP-R1, OP-G1, and OP-B1 may be changed depending on a material and thickness of the first color filter layer CF1, and are not particularly limited. For example, the width of the first-first light emitting opening OP-B1 and the width of the first-third light emitting opening OP-R1 may be substantially similar to each other.

In an embodiment, the first color filter layer CF1 may include a first-first sub-color filter CF1-B, a first-second sub-color filter CF1-G, and a first-third sub-color filter CF1-R.

The first-first sub-color filter CF1-B may be disposed to overlap a light emitting layer EML-B of the first-first sub-pixel E11M, in a plan view. According to an embodiment, the first-first sub-color filter CF1-B may be disposed on the first-first sub-pixel E11M emitting the blue light and may transmit the blue light.

The first-second sub-color filter CF1-G may be disposed to overlap a light emitting layer EML-G of the first-second sub-pixel E12M, in a plan view. According to an embodiment, the first-second sub-color filter CF1-G may be disposed on the first-second sub-pixel E12M emitting the green light and may transmit the green light.

The first-third sub-color filter CF1-R may be disposed to overlap a light emitting layer EML-R of the first-third sub-pixel E13M, in a plan view. According to an embodiment, the first-third sub-color filter CF1-R may be disposed on the first-third sub-pixel E13M emitting the red light and may transmit the red light.

A thickness in cross section of the first-first sub-color filter CF1-B may be referred to as a first-first thickness T1-B. A thickness in cross section of the first-second sub-color filter CF1-G may be referred to as a first-second thickness T1-G. A thickness in cross section of the first-third sub-color filter CF1-R may be referred to as a first-third thickness T1-R.

According to an embodiment, the first-second thickness T1-G may be greater than the first-first thickness T1-B and the first-third thickness T1-R, and the first-first thickness T1-B may be greater than the first-third thickness T1-R, however, the embodiments are not limited thereto. According to an embodiment, the first-first, first-second, and first-third thicknesses T1-B, T1-G, and T1-R and the size relationship between the first-first, first-second, and first-third thicknesses T1-B, T1-G, and T1-R may be changed depending on materials of the first-first, first-second, and first-third color filters CF1-B, CF1-G, and CF1-R. For example, the first-first thickness T1-B and the first-third thickness T1-R may be substantially similar to each other.

Referring to FIG. 6B, the second pixel EP2M may be included in in the second area A2. The second pixel EP2M may include the second-first sub-pixel E21M, the second-second sub-pixel E22M, and the second-third sub-pixel E23M as described above in FIG. 4.

At least a portion of a first electrode AE-B included in the second-first sub-pixel E21M may be exposed via a second-first light emitting opening OP-B2 defined through the pixel definition layer PDL. At least a portion of a first electrode AE-G included in the second-second sub-pixel E22M may be exposed via a second-second light emitting opening OP-G2 defined through the pixel definition layer PDL. At least a portion of a first electrode AE-R included in the second-third sub-pixel E23M may be exposed via a second-third light emitting opening OP-R2 defined through the pixel definition layer PDL.

According to an embodiment, when viewed in cross section, the width of the second-third light emitting opening OP-R2 may be greater than the width of the second-second light emitting opening OP-G2 and may be smaller than the width of the second-first light emitting opening OP-B2.

In an embodiment, the second color filter layer CF2 may include a second-first sub-color filter CF2-B, a second-second sub-color filter CF2-G, and a second-third sub-color filter CF2-R.

The second-first sub-color filter CF2-B may be disposed to overlap a light emitting layer ECL-B of the second-first sub-pixel E21M, in a plan view. According to an embodiment, the second-first sub-color filter CF2-B may be disposed on the second-first sub-pixel E21M emitting the blue light and may transmit the blue light.

The second-second sub-color filter CF2-G may be disposed to overlap a light emitting layer ECL-G of the second-second sub-pixel E22M, in a plan view. According to an embodiment, the second-second sub-color filter CF2-G may be disposed on the second-second sub-pixel E22M emitting the green light and may transmit the green light.

The second-third sub-color filter CF2-R may be disposed to overlap a light emitting layer ECL-R of the second-third sub-pixel E23M, in a plan view. According to an embodiment, the second-third sub-color filter CF2-R may be disposed on the second-third sub-pixel E23M emitting the red light and may transmit the red light.

A thickness in the cross section of the second-first sub-color filter CF2-B may be defined as a second-first thickness T2-B. A thickness in the cross section of the second-second sub-color filter CF2-G may be defined as a second-second thickness T2-G. A thickness in the cross section of the second-third sub-color filter CF2-R may be defined as a second-third thickness T2-R.

According to an embodiment, the second-first thickness T2-B may be greater than the second-third thickness T2-R and may be smaller than the second-second thickness T2-G, however, the embodiments are not limited thereto. According to an embodiment, the second-first, second-second, and second-third thicknesses T2-B, T2-G, and T2-R and the size relationship between the second-first, second-second, and second-third thicknesses T2-B, T2-G, and T2-R may be changed depending on materials of the second-first, second-second, and second-third color filters CF2-B, CF2-G, and CF2-R. For example, the second-first thickness T2-B and the second-third thickness T2-R may be substantially similar to each other.

According to an embodiment, the first-first thickness T1-B of the first-first sub-color filter CF1-B shown in FIG. 6A may be smaller than the second-first thickness T2-B of the second-first sub-color filter CF2-B shown in FIG. 6B. The first-second thickness T1-G of the first-second sub-color filter CF1-G shown in FIG. 6A may be smaller than the second-second thickness T2-G of the second-second sub-color filter CF2-G shown in FIG. 6B. The first-third thickness T1-R of the first-third sub-color filter CF1-R shown in FIG. 6A may be smaller than the second-third thickness T2-R of the second-third sub-color filter CF2-R shown in FIG. 6B.

In the disclosure, a case where the first and second color filter layers CF1 and CF2 are designed to have a first luminance lifetime with respect to a first luminance may be referred to as a first case. A case where the first and second color filter layers CF1 and CF2 are designed to have a second luminance lifetime longer than the first luminance lifetime with respect to a second luminance higher than the first luminance of the first case may be referred to as a second case.

In the second case, the difference in thickness between the first color filter layer CF1 and the second color filter layer CF2 may be greater than the difference in thickness between the first color filter layer CF1 and the second color filter layer CF2 of the first case. The difference between the thicknesses of the corresponding sub-color filters may be greater in the second case than the first case. Each of the difference between the first-first thickness T1-R and the second-first thickness T2-R, the difference between the first-second thickness T1-G and the second-second thickness T2-G, and the difference between the first-third thickness T1-B and the second-third thickness T2-B may be greater in the second case than in the first case.

Accordingly, when compared with the first case, a display panel may provide increased luminance in the light blocking area BA in the second case, and the lifetime with respect to the increased luminance may also increase in the second case. Therefore, in the case where the display module 300 includes the first and second color filter layers CF1 and CF2 of the second case, the electronic module 400 (refer to FIG. 2A) may be disposed in the display area DA (refer to FIG. 2A), and the display quality of the electronic device 1000 (refer to FIG. 1) may be improved. Details will be described below in FIG. 7.

According to an embodiment, in the first case, the difference between the first-first thickness T1-B and the second-first thickness T2-B, the difference between the first-second thickness T1-G and the second-second thickness T2-G, and the difference between the first-third thickness T1-R and the second-third thickness T2-R may be similar to each other.

In the disclosure, when the difference between the first and second color filters CF1 and CF2 is equal to or greater than about 0.01 micrometers and equal to or smaller than about 0.1 micrometers, the thickness differences may be regarded as values corresponding to errors occurring during the manufacturing processes and the thicknesses may be considered as substantially similar to each other.

In the second case, the difference between the first-first thickness T1-B and the second-first thickness T2-B and the difference between the first-second thickness T1-G and the second-second thickness T2-G may have similar values, and the difference between the first-third thickness T1-R and the second-third thickness T2-R may be greater than the difference between the first-first thickness T1-B and the second-first thickness T2-B and the difference between the first-second thickness T1-G and the second-second thickness T2-G.

Figure 7:
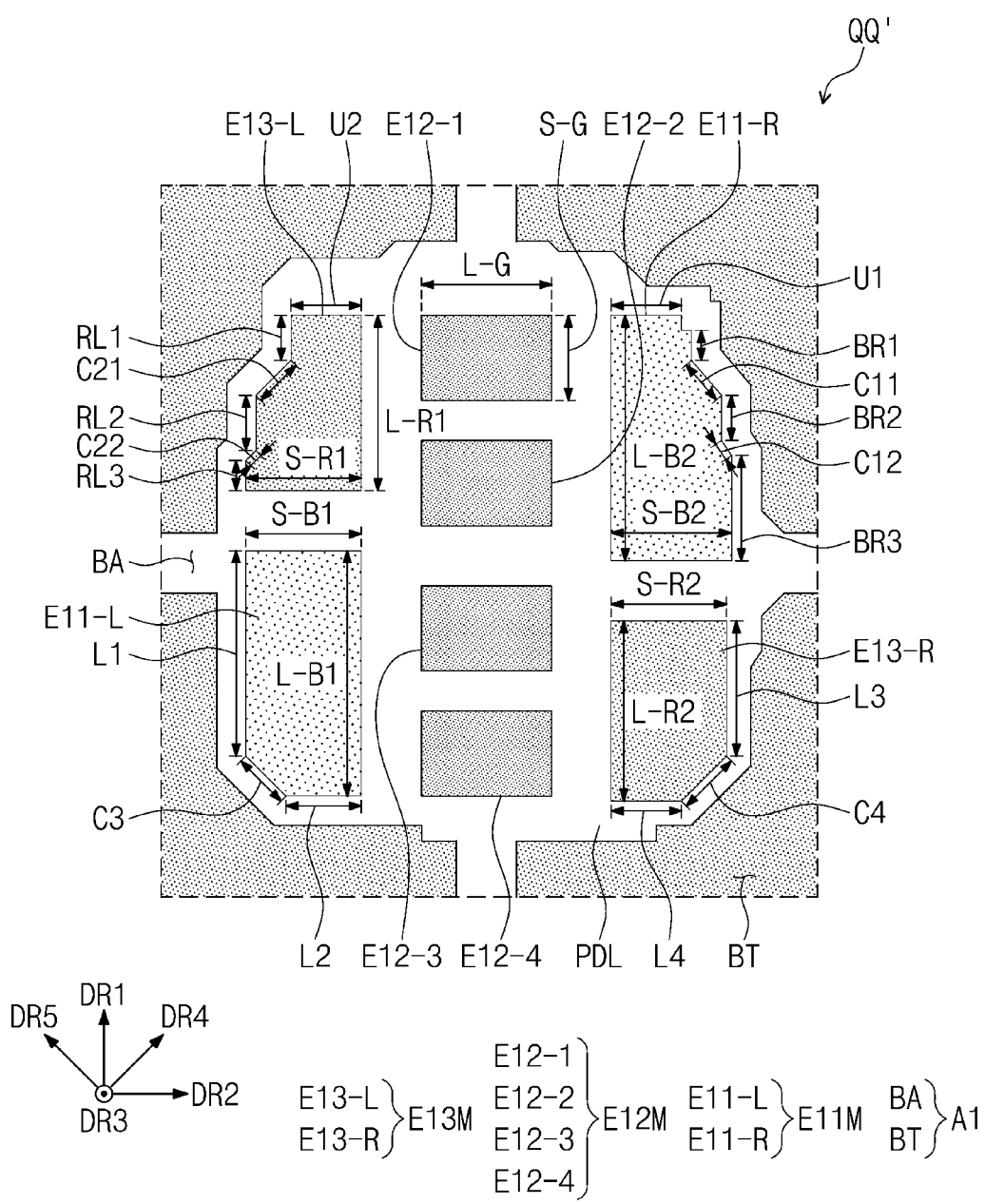
FIG. 7 is an enlarged schematic plan view showing an area QQ' of FIG. 4.

FIG. 7 is an enlarged plan view showing an area QQ' of FIG. 4. FIG. 7 shows a first pixel EP1M disposed in the light blocking area BA of the first area A1. FIG. 7 shows the first electrodes AE (refer to FIG. 5A) exposed via the first light emitting opening OP-P1 (refer to FIG. 5A) defined through the pixel definition layer PDL of the display element layer DP-OLED (refer to FIG. 5A) of the display panel 310 (refer to FIG. 5A). FIG. 7 shows the light emitting area LA (refer to FIG. 5A) defined by the first light emitting opening OP-P1.

Referring to FIG. 7, the first pixel EP1M may include two first-first sub-pixels E11M, four first-second sub-pixels E12M, and two first-third sub-pixels E13M.

According to an embodiment, the first-first sub-pixels E11M may include a first left pixel E11-L spaced apart from the first-second sub-pixels E12M to the left side and a first right pixel E11-R spaced apart from the first-second sub-pixels E12M to the right side.

The first-second sub-pixels E12M may include a first center pixel E12-1, a second center pixel E12-2, a third center pixel E12-3, and a fourth center pixel E12-4, which are sequentially arranged in the first direction DR1.

The first-third sub-pixels E13M may include a second left pixel E13-L spaced apart from the first-second sub-pixels E12M to the left side and a second right pixel E13-R spaced apart from the first-second sub-pixels E12M to the right side.

According to an embodiment, among the first-first sub-pixels E11M, the first left pixel E11-L may include a first-first long side L-B1 extending in the first direction DR1 and a first-first short side S-B1 extending in the second direction DR2 intersecting the first direction DR1. Among the first-first sub-pixels E11M, the first right pixel E11-R may include a first-second long side L-B2 extending in the first direction DR1 and a first-second short side S-B2 extending in the second direction DR2.

Each of the first, second, third, and fourth center pixels E12-1, E12-2, E12-3, and E12-4 of the first-second sub-pixels E12M may have a rectangular shape defined by second short sides S-G extending in the first direction DR1 and second long sides L-G extending in the second direction DR2.

Among the first-third sub-pixels E13M, the second left pixel E13-L may include a third-first long side L-R1 extending in the first direction DR1 and a third-first short side S-R1 extending in the second direction DR2. Among the first-third sub-pixels E13M, the second right pixel E13-R may include a third-second long side L-R2 extending in the first direction DR1 and a third-second short side S-R2 extending in the second direction DR2.

According to an embodiment, the first-first short side S-B1 of the first left pixel E11-L among the first-first sub-pixels E11M may face the third-first short side S-R1 of the second left pixel E13-L among the first-third sub-pixels E13M. The first-first short side S-B1 and the third-first short side S-R1 may have substantially the same width as each other, however, the embodiments are not limited thereto. According to an embodiment, the first-first short side S-B1 may have a width greater than a width of the third-first short side S-R1.

The first-second short side S-B2 of the first right pixel E11-R among the first-first sub-pixels E11M may face the third-second short side S-R2 of the second right pixel E13-R among the first-third sub pixels E13M. The first-second short side S-B2 and the third-second short side S-R2 may have substantially the same width as each other, however, the embodiments are not limited thereto. According to an embodiment, the first-second short side S-B2 may have a width greater than a width of the third-second short side S-R2.

The first-first long side L-B1 of the first left pixel E11-L among the first-first sub-pixels E11M may face the second short side S-G of the third center pixel E12-3 and the second short side S-G of the fourth center pixel E12-4 among the first-second sub-pixels E12M.

The first-second long side L-B2 of the first right pixel E11-R among the first-first sub-pixels E11M may face the second short side S-G of the first center pixel E12-1 and the second short side S-G of the second center pixel E12-2 among the first-second sub-pixels E12M.

The third-first long side L-R1 of the second left pixel E13-L among the first-third sub-pixels E13M may face the second short side S-G of the first center pixel E12-1 and a portion of the second short side S-G of the second center pixel E12-2 among the first-second sub-pixels E12M.

The third-second long side L-R2 of the second right pixel E13-R among the first-third sub-pixels E13M may face a portion of the second short side S-G of the third center pixel E12-3 and the second short side S-G of the fourth center pixel E12-4 among the first-second sub-pixels E12M.

Each of the first-first long side L-B1 of the first left pixel E11-L and the first-second long side L-B2 of the first right pixel E11-R may have a width greater than a width of each of the third-first long side L-R1 of the second left pixel E13-L and the third-second long side L-R2 of the second right pixel E13-R.

Among the first-first sub-pixels E11M, the first right pixel E11-R may include right sides BR1, BR2, and BR3 adjacent to the transmission area BT, extending in the first direction DR1, and spaced apart from each other in the fifth direction DR5, a first upper side U1 adjacent to the transmission area BT and extending from the first-second long side L-B2 to the second direction DR2, and first connection sides C11 and C12 extending in the fifth direction DR5. The first connection sides C11 and C12 may connect the right sides BR1, BR2, and BR3 that are adjacent to each other.

According to an embodiment, the first right pixel E11-R may include a step difference area defined by the right sides BR1, BR2, and BR3 and the first connection sides C11 and C12 connecting the right sides BR1, BR2, and BR3, and the step difference area may have a similar shape to a stepped shape. The first right pixel E11-R may include multiple step difference areas, and the step difference areas may be defined adjacent to the transmission area BT.

Among the first-third sub-pixels E13M, the second left pixel E13-L may include multiple left sides RL1, RL2, and RL3 adjacent to the transmission area BT, extending in the first direction DR1, and spaced apart from each other in the fourth direction DR4, a second upper side U2 adjacent to the transmission area BT and extending from the third-first long side L-R1 to the second direction DR2, and second connection sides C21 and C22 extending in the fourth direction DR4. The second connection sides C21 and C22 may connect the left sides RL1, RL2, and RL3 that are adjacent to each other.

According to an embodiment, the second left pixel E13-L may include a step difference area defined by the left sides RL1, RL2, and RL3 and the second connection sides C21 and C22 connecting the left sides RL1, RL2, and RL3, and the step difference area may have a similar shape to a stepped shape. The second left pixel E13-L may include multiple step difference areas, and the step difference areas may be defined adjacent to the transmission area BT.

FIG. 7 shows the shape of the step difference area of the first right pixel E11-R and the second left pixel E13-L as an example. However, the shape of the step difference area may be changed by according to the design of the transmission area BT.

Among the first-first sub-pixels E11M, the first left pixel E11-L may include a first lower side L1 adjacent to the transmission area BT and extending in the first direction DR1, a second lower side L2 extending from the first-first long side L-B1 to the second direction DR2, and a third connection side C3 extending in the fifth direction DR5 and connecting the first lower side L1 and the second lower side L2.

The first left pixel E11-L may have a pentagonal shape defined by removing a portion of the left side from the rectangular shape defined by the sides extending in the first and second directions DR1 and DR2.

Among the first-third sub-pixels E13M, the second right pixel E13-R may include a third lower side L3 adjacent to the transmission area BT and extending in the first direction DR1, a fourth lower side L4 extending from the third-second long side L-R2 to the second direction DR2, and a fourth connection side C4 extending in the fifth direction DR5 and connecting the third lower side L3 and the fourth lower side L4.

The second right pixel E13-R may have a pentagonal shape defined by removing a portion of the right side from the rectangular shape defined by the sides extending in the first and second directions DR1 and DR2.

According to an embodiment, the first upper side U1 of the first right pixel E11-R, the long side adjacent to the transmission area BT of the second long sides L-G of the first center pixel E12-1, and the second upper side U2 of the second left pixel E13-L may be aligned in a row with respect to the second direction DR2. The second lower side L2 of the first left pixel E11-L, the long side adjacent to the transmission area BT of the second long sides L-G of the fourth center pixel E12-4, and the fourth lower side L4 of the second right pixel E13-R may be aligned in a row with respect to the second direction DR2.

However, the embodiments are not limited regarding the alignment of the sub-pixels. For example, the first upper side U1 of the first right pixel E11-R and the second upper side U2 of the second left pixel E13-L may be disposed to overlap the second short side S-G of the first center pixel E12-1 with respect to the second direction DR2. The second lower side L2 of the first left pixel E11-L and the fourth lower side L4 of the second right pixel E13-R may be disposed to overlap the second short side S-G of the fourth center pixel E12-4 with respect to the second direction DR2.

In the second case described with reference to FIG. 6B, the first-first short side S-B1 and the first-first long side L-B1 of the first left pixel E11-L among the first-first sub-pixels E11M and the first-second short side S-B2 and the first-second long side L-B2 of the first right pixel E11-R among the first-first sub-pixels E11M may have a relatively large width compared to the first case.

In the second case, the second short side S-G and the second long side L-G of each of the first-second sub-pixels E12M may have a relatively large width when compared to the first case.

In the second case, the third-first short side S-R1 and the third-first long side L-R1 of the second left pixel E13-L among the first-third sub-pixels E13M and the third-second short side S-R2 and the third-second long side L-R2 of the second right pixel E13-R among the first-third sub-pixels E13M may have a relatively large width compared to the first case.

The difference in width between a side of the first-first, first-second, and first-third sub-pixels E11M, E12M, and E13M in the second case and a side of corresponding sub-pixels in the first case may be equal to or greater than about 0.2 micrometers and equal to or smaller than about 15 micrometers. The size of the first light emitting opening OP-P1 of each of the first-first, first-second, and first-third sub-pixels E11M, E12M, and E13M in the second case may be greater than that in the first case.

Accordingly, a distance between the first-first, first-second, and first-third sub-pixels E11M, E12M, and E13M in the second case may be smaller than that in the first case. The width of the pixel definition layer PDL disposed between the sub-pixels may be reduced.

The difference in thickness between the first and second color filter layers CF1 and CF2 in the second case may be greater than that in the first case, and the size of the first light emitting openings OP-P1 of the pixel definition layer PDL of the light blocking area BA in the second case may be greater than that of the first case. Accordingly, the electronic device 1000 (refer to FIG. 1) in the second case may provide light with a relatively higher luminance in the light blocking area BA than the electronic device 1000 in the first case. The lifetime with respect to the light having the relatively higher luminance than that of first case may increase.

Accordingly, the thickness of the color filter layers CF1 and CF2 and the size of the first light emitting openings OP-P1 of the electronic device 1000 may be adjusted. Thus, the performance of the electronic module 400 may be improved, and the display quality of the image provided through the display module 300 may be improved.

Figure 8A:
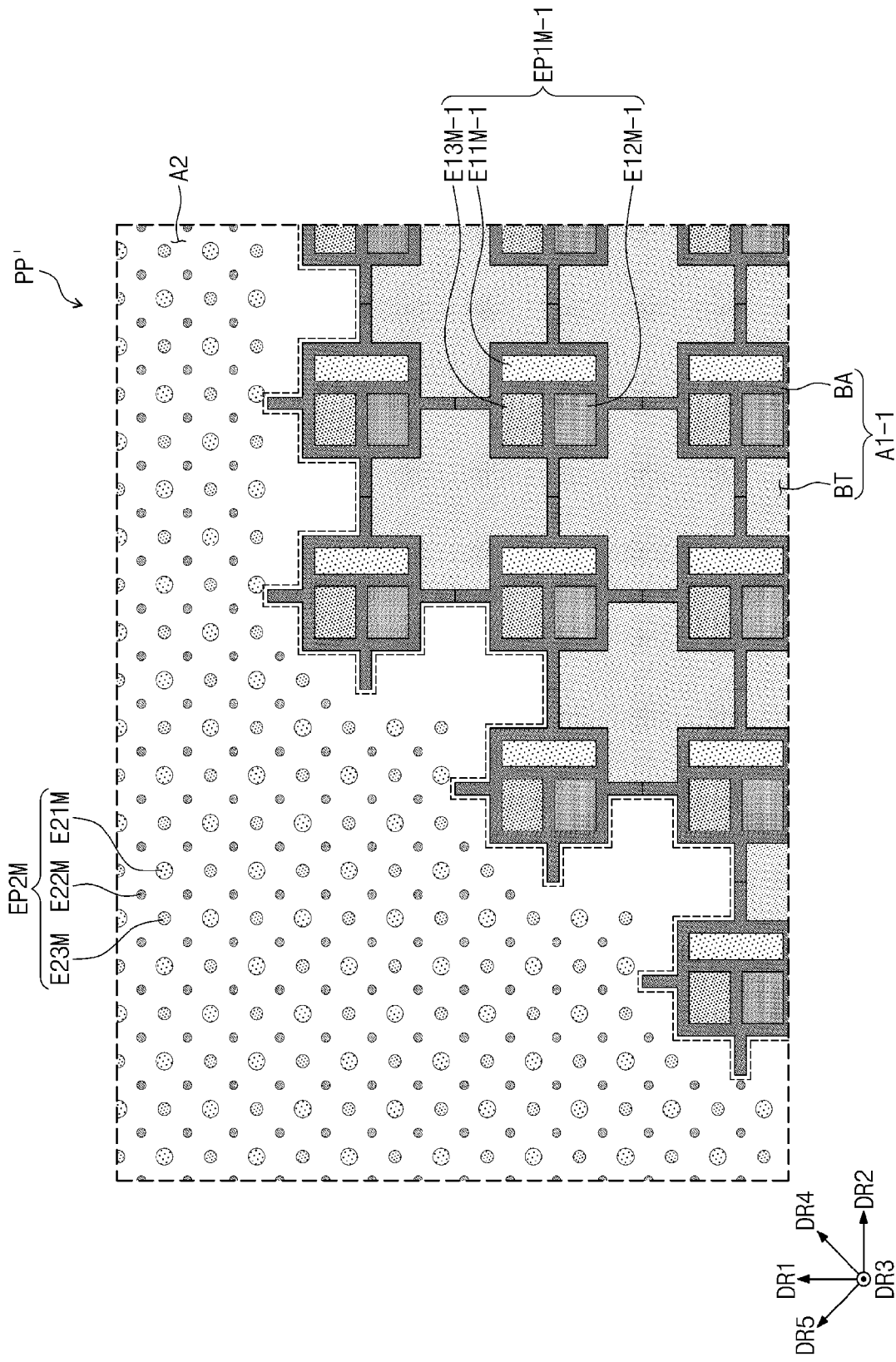
FIG. 8A is a schematic plan view showing a display area according to an embodiment of the disclosure.
Figure 8B:
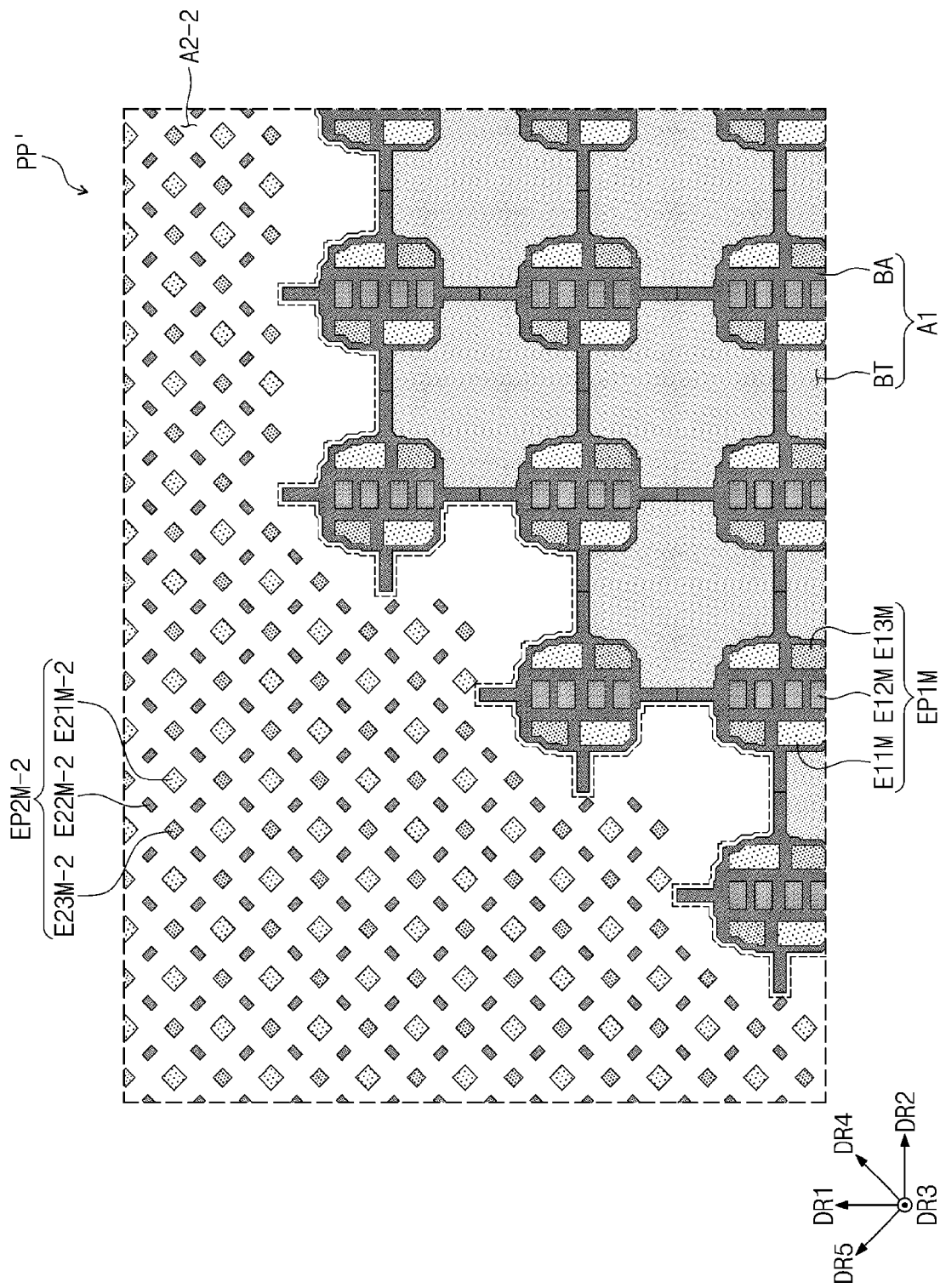
FIG. 8B is a schematic plan view showing a display area according to an embodiment of the disclosure.

FIG. 8A is a schematic plan view showing a display area according to an embodiment of the disclosure. FIG. 8B is a schematic plan view showing a display area according to an embodiment of the disclosure. FIGS. 8A and 8B are enlarged plan views showing the area PP' of FIG. 2A.

Referring to FIG. 8A, a first pixel EP1M-1 included in a first area A1-1 may have a shape and an arrangement that are different from those of the first pixel EP1M shown in FIG. 4. In an embodiment, the first pixel EP1M-1 disposed in the first area A1-1 may include a first-first sub-pixel E11M-1, a first-second sub-pixel E12M-1, and a first-third sub-pixel E13M-1.

The first-first sub-pixel E11M-1 may have a rectangular shape defined by long sides extending in the first direction DR1 and short sides extending in the second the direction DR2. Each of the first-second and first-third sub-pixels E12M-1 and E13M-1 may have a rectangular shape defined by short sides extending in the first direction DR1 and long sides extending in the second direction DR2.

According to an embodiment, the first-second sub-pixel E12M-1 and the first-third sub-pixel E13M-1 may be spaced apart from each other in the first direction DR1. The first-first sub-pixel E11M-1 may be spaced apart from each of the first-second sub-pixel E12M-1 and the first-third sub-pixel E13M-1 in the second direction DR2. One of the long sides of the first-first sub-pixel E11M-1 may face one of the short sides of the first-second sub-pixel E12M-1 and one of the short sides of the first-third sub-pixel E13M-1.

Referring to FIG. 8B, a second pixel EP2M-2 included in a second area A2-2 may have a shape different from that of the second pixel EP2M shown in FIGS. 4 and 8A. The second-first, second-second, and second-third sub-pixels E21M-2, E22M-2, and E23M-2 of the second pixel E12M-2 may also be arranged in a PENTILE™ structure.

For example, the second-first sub-pixel E21M-2 may have a square shape defined by the fourth direction DR4 and the fifth direction DR5. The second-first sub-pixel E21M-2 may have a lozenge shape with respect to first-first sub-pixels E11M emitting the same color among sub-pixels E11M, E12M, and E13M disposed in a first area A1.

The second-second sub-pixel E22M-2 may have a rectangular shape defined by the fourth direction DR4 and the fifth direction DR5. The second-second sub-pixel E22M-2 may have a lozenge shape with respect to first-second sub-pixels E12M emitting the same color among the sub-pixels E11M, E12M, and E13M disposed in the first area A1.

The second-third sub-pixel E23M-2 may have a square shape defined by the fourth direction DR4 and the fifth direction DR5. The second-third sub-pixel E23M-2 may have a lozenge shape with respect to first-third sub-pixels E13M emitting the same color among the sub-pixels E11M, E12M, and E13M disposed in the first area A1.

A light emission size of the sub-pixels E21M-2, E22M-2, and E23M-2 of the second pixel EP2M-2 may increase in the order of the second-second sub-pixel E22M-2, the second-third sub-pixel E23M-2, and the second-first sub-pixel E21M-2.

Embodiments have been disclosed herein, and although terms are employed, they are used and are to be interpreted in a generic and descriptive sense only and not for purpose of limitation. In some instances, as would be apparent by one of ordinary skill in the art, features, characteristics, and/or elements described in connection with an embodiment may be used singly or in combination with features, characteristics, and/or elements described in connection with other embodiments unless otherwise specifically indicated. Accordingly, it will be understood by those of ordinary skill in the art that various changes in form and details may be made without departing from the spirit and scope of the disclosure as set forth in the following claims.

What is claimed is:

1. An electronic device comprising:
    a display panel comprising:
        a first area comprising:
            a light blocking area; and
            a transmission area;
        a first pixel disposed in the first area;
        a second area adjacent to the first area, the second area having lower light transmittance than the first area; and
        a second pixel disposed in the second area;
    an input sensor disposed on the display panel, the input sensor comprising:
        at least one insulating layer; and
        a conductive layer;
    a black matrix disposed on the at least one insulating layer;
    a first color filter layer disposed on the at least one insulating layer, the first color filter layer overlapping the first pixel in a plan view; and
    a second color filter layer disposed on the at least one insulating layer, the second color filter layer overlapping the second pixel in a plan view and being of a same color as the first color filter layer, and the first color filter layer and the second color filter layer have an integrated shape connected to each other,
    wherein a thickness of the first color filter layer is smaller than a thickness of the second color filter layer.

2. The electronic device of claim 1, wherein the thickness of the first color filter layer is equal to or greater than about 60% of the thickness of the second color filter layer and is equal to or smaller than about 90% of the thickness of the second color filter layer.

3. The electronic device of claim 1, wherein a difference between the thickness of the first color filter layer and the thickness of the second color filter layer is equal to or greater than about 0.3 micrometers and is equal to or smaller than about 1.5 micrometers.

4. The electronic device of claim 1, wherein each of the first pixel and the second pixel comprises:
    at least one first sub-pixel;
    at least one second sub-pixel; and
    at least one third sub-pixel,
    each of the at least one first sub-pixel, the at least one second sub-pixel, and the at least one third sub-pixel emit a light having a different color from each other,
    each of the first color filter layer and the second color filter layer comprises:
        a first sub-color filter;
        a second sub-color filter; and
        a third sub-color filter, and
    the first sub-color filter, the second sub-color filter, and the third sub-color filter each respectively overlap the at least one first sub-pixel, the at least one second sub-pixel, and the at least one third sub-pixel, in a plan view.

5. The electronic device of claim 4, wherein
    in the first color filter layer, the first sub-color filter, the second sub-color filter, and the third sub-color filter each have a thickness that is different from each other, and
    in the second color filter layer, the first sub-color filter, the second sub-color filter, and the third sub-color filter each have a thickness that is different from each other.

6. The electronic device of claim 4, wherein a difference between a thickness of the first sub-color filter of the first color filter layer and a thickness of the first sub-color filter of the second color filter layer is substantially similar to a difference between a thickness of the second sub-color filter of the first color filter layer and a thickness of the second sub-color filter of the second color filter layer.

7. The electronic device of claim 6, wherein a difference between a thickness of the third sub-color filter of the first color filter layer and a thickness of the third sub-color filter of the second color filter layer is greater than a difference between a thickness of the first sub-color filter of the first color filter layer and a thickness of the first sub-color filter of the second color filter layer.

8. The electronic device of claim 4, wherein an arrangement of the at least one first sub-pixel, the at least one second sub-pixel, and the at least one third sub-pixel of the first pixel and an arrangement of the at least one first sub-pixel, the at least one second sub-pixel, and the at least one third sub-pixel of the second pixel are different from each other.

9. The electronic device of claim 8, wherein
    in the first pixel, the at least one first sub-pixel comprises two first sub-pixels, the at least one second sub-pixel comprises four second sub-pixels, and the at least one third sub-pixel comprises two third sub-pixels,
    the four second sub-pixels are spaced apart from each other in a first direction,
    one of the two first sub-pixels and one of the two third sub-pixels are spaced apart from each other in a second direction intersecting the first direction with the four second sub-pixels interposed between the one of the two first sub-pixels and the one of the two third sub-pixels,
    another one of the two first sub-pixels is spaced apart from the one of the two third sub-pixels in the first direction, and
    another one of the two third sub-pixels is spaced apart from the one of the two first sub-pixels in the first direction.

10. The electronic device of claim 9, wherein
each of the four second sub-pixels has a short side extending in the first direction and a long side extending in the second direction,
each of the two first sub-pixels and each of the two third sub-pixels have a long side extending in the first direction and a short side extending in the second direction,
the short side of each of the two first sub-pixels faces the short side of each of the two third sub-pixels that are spaced apart, and
the long side of each of the two first sub-pixels and the long side of each of the two third sub-pixels face the short side of at least one of the four second sub-pixels.

11. The electronic device of claim 9, wherein
one of the two first sub-pixels has right sides that extend in the first direction and has first connection sides that connect the right sides adjacent to each other, and
the first connection sides extend in an oblique direction with respect to the first direction and the second direction.

12. The electronic device of claim 11, wherein
one of the two third sub-pixels has left sides that extend in the first direction and has second connection sides that connect the left sides adjacent to each other, and
the second connection sides extend in a direction intersecting the oblique direction.

13. The electronic device of claim 9, wherein
in the second pixel, the at least one second sub-pixel comprises two second sub-pixels that are spaced apart from each other in the second direction, and
the at least one first sub-pixel of the second pixel and the at least one third sub-pixel of the second pixel are spaced apart from each other in the second direction.

14. The electronic device of claim 4, wherein
in the first pixel, the at least one second sub-pixel and the at least one third sub-pixel are spaced apart from each other in a first direction,
in the first pixel, the at least one first sub-pixel is spaced apart from the at least one second sub-pixel and the at least one third sub-pixel in a second direction intersecting the first direction,
in the first pixel, the at least one second sub-pixel and the at least one third sub-pixel each have a short side extending in the first direction and a long side extending in the second direction, and the at least one first sub-pixel has a long side extending in the first direction and a short side extending in the second direction, and
in the first pixel, the long side of the at least one first sub-pixel overlaps the short side of each of the at least one second sub-pixel and the at least one third sub-pixel, in the second direction.

15. The electronic device of claim 1, wherein the second pixel has a circular shape or a quadrangular shape.

16. The electronic device of claim 1, wherein
each of the first pixel and the second pixel comprises:
 transistors; and
 a light emitting diode electrically connected to at least one of the transistors,
the display panel comprises:
 a base layer;
 a buffer layer disposed on the base layer; and
 a light blocking layer disposed between the buffer layer and the transistors, and
the light blocking layer overlaps the light blocking area of the first area in a plan view, and does not overlap the transmission area of the first area in a plan view.

17. The electronic device of claim 16, wherein
the display panel comprises:
 inorganic insulating layers disposed on the light blocking layer; and
 an organic insulating layer disposed on the inorganic insulating layers,
the inorganic insulating layers overlap the transmission area in a plan view and surround a transmission opening that exposes at least a portion of the buffer layer, and
the organic insulating layer is disposed in the transmission opening, and covers the exposed portion of the buffer layer.

18. The electronic device of claim 1, wherein
the first color filter layer and the black matrix overlap the light blocking area of the first area, in a plan view, and do not overlap the transmission area of the first area, in a plan view, and
the second color filter layer and the black matrix may overlap the second area, in a plan view.

19. The electronic device of claim 1, wherein
the display panel further comprises an overcoat layer disposed on the first color filter layer and the second color filter layer,
at least a portion of an upper surface of the black matrix is covered by the first color filter layer and the second color filter layer,
a portion of the upper surface of the black matrix adjacent to the transmission area is covered by the first color filter layer, and
another portion of the upper surface of the black matrix is covered by the overcoat layer.

20. The electronic device of claim 1, further comprising:
an electronic module overlapping the first area in a plan view, the electronic module being disposed under the display panel,
wherein the electronic module comprises at least one of a light emitting module, a light receiving module, and a camera module.

* * * * *